United States Patent
Fotak et al.

(10) Patent No.: US 11,623,534 B2
(45) Date of Patent: *Apr. 11, 2023

(54) SYSTEMS AND METHODS FOR DETERMINING A VEHICLE ALTERNATOR CONDITION

(71) Applicant: Geotab Inc., Oakville (CA)

(72) Inventors: Meghan Frances Fotak, Mississauga (CA); Jialin Zhu, Toronto (CA); James David Johnston, Temple, GA (US); Weinan Sun, Mississauga (CA); Matthew Konski, Mount Hope (CA); Michael Angelo David Santorelli, Concord (CA); Daniel Alec Sheen, Burlington (CA)

(73) Assignee: Geotab Inc., Oakville (CA)

(*) Notice: Subject to any disclaimer, the term of this patent is extended or adjusted under 35 U.S.C. 154(b) by 0 days.

This patent is subject to a terminal disclaimer.

(21) Appl. No.: 17/731,321

(22) Filed: Apr. 28, 2022

(65) Prior Publication Data

US 2022/0388409 A1 Dec. 8, 2022

Related U.S. Application Data

(60) Provisional application No. 63/244,294, filed on Sep. 15, 2021, provisional application No. 63/197,054, filed on Jun. 4, 2021.

(51) Int. Cl.
*G07C 5/08* (2006.01)
*B60L 53/24* (2019.01)
*B60L 53/53* (2019.01)

(52) U.S. Cl.
CPC .............. *B60L 53/24* (2019.02); *B60L 53/53* (2019.02); *G07C 5/0808* (2013.01); *G07C 5/0816* (2013.01)

(58) Field of Classification Search
None
See application file for complete search history.

(56) References Cited

U.S. PATENT DOCUMENTS

| 4,839,575 A | 6/1989 | MacFarlane |
| 6,150,793 A * | 11/2000 | Lesesky ............ H02J 7/007192 320/103 |

(Continued)

FOREIGN PATENT DOCUMENTS

| JP | 2005102436 A | 4/2005 |
| WO | 2020120514 A1 | 6/2020 |

OTHER PUBLICATIONS

Vladimirovich Puzakov Andrey: 'Fault diagnosis in automotive alternators based on the output voltage parameters', 2019 International Conference On Electrotechnical Complexes and Systems (ICOECS), IEEE, Oct. 21, 2019 (Oct. 21, 2019), pp. 1-5, XP033684207, DOI: 10.1109/ICOECS46375.2019.8949994.

(Continued)

*Primary Examiner* — Daniel L Greene
(74) *Attorney, Agent, or Firm* — Sherif A. Abdel-Kader

(57) ABSTRACT

Methods and systems for determining an alternator condition in a motor vehicle are provided. The method includes receiving a maximum cranking voltage and a maximum cranking voltage time stamp from the motor vehicle over an asset interface of the telematics device; receiving a maximum device voltage and a maximum device voltage time stamp from the motor vehicle over the asset interface, and determining a potential alternator undercharging condition if a duration between the maximum cranking voltage time stamp and the maximum device voltage time stamp is greater than an undercharging indicator duration threshold. Advantageously, an alternator may be repaired or replaced before it fails thus averting having the motor vehicles inoperable.

10 Claims, 17 Drawing Sheets

(56) References Cited

U.S. PATENT DOCUMENTS

| | | | |
|---|---|---|---|
| 9,761,066 B2 | 9/2017 | Chen | |
| 10,719,997 B1* | 7/2020 | Aiello | G07C 5/008 |
| 11,328,541 B2 | 5/2022 | Aiello | |
| 2007/0103284 A1 | 5/2007 | Chew | |
| 2009/0271239 A1* | 10/2009 | Underdal | G06Q 10/20 |
| | | | 705/305 |
| 2010/0035602 A1 | 2/2010 | Doherty | |
| 2010/0100306 A1* | 4/2010 | Gamache | F02N 11/0803 |
| | | | 701/113 |
| 2011/0082621 A1* | 4/2011 | Berkobin | B60L 58/16 |
| | | | 701/31.4 |
| 2012/0029852 A1* | 2/2012 | Goff | G01R 31/371 |
| | | | 702/63 |
| 2013/0127611 A1 | 5/2013 | Bernstein | |
| 2015/0154816 A1 | 6/2015 | Chen | |
| 2016/0003919 A1* | 1/2016 | Hirschbold | G01R 31/3835 |
| | | | 324/433 |
| 2016/0031324 A1* | 2/2016 | Kim | H02J 7/00 |
| | | | 701/34.4 |
| 2016/0078695 A1* | 3/2016 | McClintic | G07C 5/0816 |
| | | | 701/29.4 |
| 2019/0385386 A1 | 12/2019 | Davidson | |
| 2020/0371581 A1 | 11/2020 | Hureau | |
| 2021/0221312 A1 | 7/2021 | Jenkins | |
| 2021/0255247 A1* | 8/2021 | Alleva | G07C 5/0808 |

OTHER PUBLICATIONS

European Patent Office, Extended European Search Report dated Nov. 9, 2022 10 pages.

* cited by examiner

SYSTEMS AND METHODS FOR DETERMINING A VEHICLE ALTERNATOR CONDITION

CROSS-REFERENCE TO RELATED APPLICATIONS

This application claims priority from U.S. Provisional Application 63/244,294 filed on 15 Sep. 2021, the contents of which are herein incorporated by reference. This application also claims priority from U.S. Provisional Application 63/197,054 filed on 4 Jun. 2021, the contents of which are herein incorporated by reference.

FIELD

The present disclosure relates generally to vehicle diagnostics, and more particularly to a system and method for determining a vehicle alternator condition.

BACKGROUND

Most vehicle nowadays are powered by internal combustion engines in which a fuel mixture is ignited thus generating mechanical power, which is in turn converted to rotational motion of the vehicle's wheels. Motor vehicles need electricity to operate. For example, electric energy is needed to power lights, gauges, an air conditioning system, an entertainment system, and other electrically powered components ("electrical components") of the vehicle. For gasoline engines, electric energy is also needed to power the spark plugs which ignite the fuel mixture. Accordingly, vehicles are equipped with batteries for providing electric energy to power the electrical components. A vehicle battery will lose its charge if it is the sole source of electric energy in the vehicle. Accordingly, vehicles are equipped with electric generators, which convert the mechanical energy produced by the internal combustion engine to electric energy and use that electric energy to charge the vehicle battery.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a method by a telematics device. The method includes receiving a maximum cranking voltage and a maximum cranking voltage time stamp from the motor vehicle over an asset interface of the telematics device; receiving a maximum device voltage and a maximum device voltage time stamp from the motor vehicle over the asset interface, and determining a potential alternator undercharging condition if a duration between the maximum cranking voltage time stamp and the maximum device voltage time stamp is greater than an undercharging indicator duration threshold. Other embodiments of this aspect include corresponding computer systems, apparatus, and computer programs recorded on one or more computer storage devices, each configured to perform the actions of the methods.

Implementations may include one or more of the following features. The method where the undercharging indicator duration threshold is 200 seconds. The method may include repeating the steps of receiving and determining a plurality of times and activating an alerting device in response to the determining of the potential alternator undercharging condition more than once in the plurality of times. Activating the alerting device may include activating an indicator light. Activating the alerting device may include activating a buzzer. Implementations of the described techniques may include hardware, a method or process, or computer software on a computer-accessible medium.

One general aspect includes a telematics device. The telematics device also includes a controller; an asset interface coupled to the controller; and a non-transitory memory storing machine-executable instructions which, when executed by the controller, configure the telematics device to: receive a maximum cranking voltage and a maximum cranking voltage time stamp from a motor vehicle over the asset interface; receive a maximum device voltage and a maximum device voltage time stamp from the motor vehicle over the asset interface; and determine a potential alternator undercharging condition if a duration between the maximum cranking voltage time stamp and the maximum device voltage time stamp is greater than an undercharging indicator duration threshold. The undercharging indicator duration threshold may be 200 seconds. The machine-executable instructions may further comprise machine-executable instructions which repeat the steps of receiving the maximum cranking voltage and maximum cranking voltage time stamp, receiving the maximum device voltage and maximum device voltage time stamp and determining the potential alternator undercharging condition a plurality of times and activate an alerting device in response to determining of the potential alternator undercharging condition more than once in the plurality of times.

The machine-executable instructions which activate the alerting device may comprise machine-executable instructions which activate an indicator light.

The machine-executable instructions which activate the alerting device may comprise machine-executable instructions which activate a buzzer.

Other embodiments of this aspect include corresponding computer systems, apparatus, and computer programs recorded on one or more computer storage devices, each configured to perform the actions of the methods.

One general aspect includes a method. The method includes receiving, by a telematics device, a maximum cranking voltage and a maximum cranking voltage time stamp from a motor vehicle over an asset interface of the telematics device; receiving, by the telematics device, a maximum device voltage and a maximum device voltage time stamp from the motor vehicle over the asset interface of the telematics device; sending, by the telematics device, the maximum cranking voltage, the maximum cranking voltage time stamp, the maximum device voltage, and the maximum device voltage time stamp, over a network interface, to a telematics server; and determining a potential alternator undercharging condition if a duration between the maximum cranking voltage time stamp and the maximum device voltage time stamp is greater than an undercharging indicator duration threshold.

The method may further comprise sending, by the telematics server, an indication of a potential alternator undercharging condition to an administration terminal over the network interface.

The undercharging indicator duration threshold may be 200 seconds.

One general aspect includes a method by a telematics device. The method also includes receiving a maximum cranking voltage and a maximum cranking voltage time stamp from the motor vehicle over an asset interface of the telematics device; receiving a maximum device voltage and a maximum device voltage time stamp from the motor vehicle over the asset interface; and sending the maximum cranking voltage, the maximum cranking voltage time stamp, the maximum device voltage, and the maximum device voltage time stamp, over a network interface, to a telematics server. Other embodiments of this aspect include corresponding computer systems, apparatus, and computer programs recorded on one or more computer storage devices, each configured to perform the actions of the methods.

Implementations may include one or more of the following features. The method may include repeating the steps of receiving and sending. The method may include receiving an indication, from the telematics server, of an alternator undercharging condition. The method may include activating an alerting device in response to receiving the indication of an alternator undercharging condition. Activating an alerting device may include activating an indicator light. Activating an alerting device may include activating a buzzer. Implementations of the described techniques may include hardware, a method or process, or computer software on a computer-accessible medium.

One general aspect includes a telematics device. The telematics device also includes a controller; an asset interface coupled to the controller; a network interface coupled to the controller; and a non-transitory memory storing machine-executable instructions which, when executed by the controller, configure the telematics device to: receive a maximum cranking voltage and a maximum cranking voltage time stamp from a motor vehicle over the asset interface; receive a maximum device voltage and a maximum device voltage time stamp from the motor vehicle over the asset interface; and send the maximum cranking voltage, the maximum cranking voltage time stamp, the maximum device voltage, and the maximum device voltage time stamp, over the network interface, to a telematics server. Other embodiments of this aspect include corresponding computer systems, apparatus, and computer programs recorded on one or more computer storage devices, each configured to perform the actions of the methods.

One general aspect includes a method by a telematics server. The method also includes receiving, over a network interface, from a telematics device a maximum cranking voltage, a maximum cranking voltage time stamp, a maximum device voltage, and a maximum device voltage time stamp associated with a motor vehicle coupled to the telematics device; and determining a potential alternator undercharging condition if a duration between the maximum cranking voltage time stamp and the maximum device voltage time stamp is greater than an undercharging indicator duration threshold. Other embodiments of this aspect include corresponding computer systems, apparatus, and computer programs recorded on one or more computer storage devices, each configured to perform the actions of the methods.

Implementations may include one or more of the following features. The method may include sending an indication of a potential alternator undercharging condition to an administration terminal over the network interface. Implementations of the described techniques may include hardware, a method or process, or computer software on a computer-accessible medium.

One general aspect includes a telematics server. The telematics server also includes a controller; a network interface coupled to the controller; and a non-transitory memory storing machine-executable instructions which, when executed by the controller, configure the telematics server to: receive, over the network interface, from a telematics device a maximum cranking voltage, a maximum cranking voltage time stamp, a maximum device voltage, and a maximum device voltage time stamp associated with a motor vehicle coupled to the telematics device; determine, by an analysis module, a potential alternator undercharging condition if a duration between the maximum cranking voltage time stamp and the maximum device voltage time stamp is greater than an undercharging indicator duration threshold. Other embodiments of this aspect include corresponding computer systems, apparatus, and computer programs recorded on one or more computer storage devices, each configured to perform the actions of the methods.

Implementations may include one or more of the following features. The telematics server where the machine-executable instructions when executed by the controller, further configure the telematics server to send, by an alert module, an indication of a potential alternator undercharging condition to an administration terminal over the network interface. Implementations of the described techniques may include hardware, a method or process, or computer software on a computer-accessible medium.

DETAILED DESCRIPTION

Figure 1:
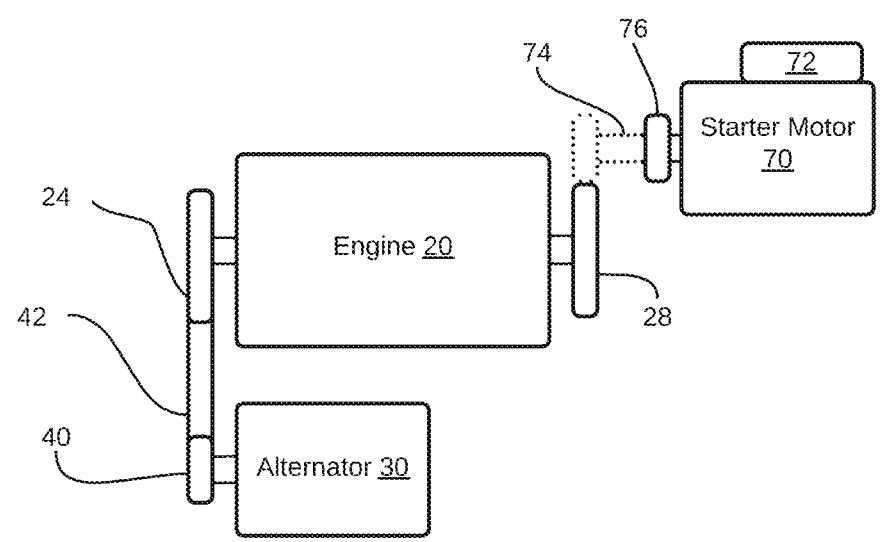
FIG. 1 is a simplified diagram depicting an internal combustion engine mechanically coupled to both an alternator and a starter motor.

In this disclosure, the terms "electricity", "electric energy", "electrical energy" and "electrical power" are used interchangeably and refers to electrical energy. A skilled person would understand that electricity is a form of energy, and that power is energy in a unit time. An electric battery or a generator provide electricity, electric energy, or electric power to power one or more electrical components.

In this disclosure, the terms "generator" and "alternator" are used interchangeably and refers to an alternating current (AC) generator deployed in conjunction with an engine for converting rotational mechanical energy to electrical energy.

In this disclosure, the terms "electric battery", "vehicle battery", or "battery" refer to a battery deployed in a vehicle to provide electric energy to one or more electrical components. A vehicle battery may be a lead acid battery or any other suitable type of battery.

Vehicles and Batteries

Motor vehicles are equipped with batteries for providing electric energy to power the electrical components thereof. Typical vehicle batteries are either 12V batteries or 24V batteries. In this disclosure, mainly 12V batteries will be discussed, but it would be apparent to those of skill in the art that the methods described would be equally applicable to 24V batteries, and to batteries operating at other voltages. A vehicle battery needs to be charged such that it provides a battery output voltage which is in a battery operating voltage range. The battery operating voltage range has a lower battery output voltage limit and an upper battery output voltage limit. When the vehicle battery output voltage drops below the lower battery output voltage limit, the battery is considered undercharged and needs to be charged or it will not provide sufficient electrical power to the various electrical components. In the example of a 12V battery, the lower battery output voltage limit has been found to be 12.2V. When the vehicle battery output voltage rises above the upper battery output voltage limit, the vehicle battery is considered overcharged. An overcharged battery may deteriorate quickly and the vehicle battery output voltage, which is higher than the upper battery output voltage limit, may cause damage to some of the electrical components of the vehicle. In the example of a 12V battery, the upper battery output voltage limit has been found to be 12.6V. It is therefore generally desirable to keep the battery output voltage of a 12V vehicle battery between 12.2V and 12.6V.

Cranking

Internal combustion engines need to be cranked to start their operation. Cranking an engine involves rotating the engine's crank shaft causing the pistons to move in a reciprocating manner within their corresponding cylinders. Rotating the crank shaft also causes intake valves to open letting air into the cylinders and causes an injection pump to inject fuel into the cylinders. For engines using carburetors, the intake valves let a fuel mixture of gasoline and air into the cylinders. For gasoline engines, cranking also causes the spark plugs to be activated thus igniting the fuel mixture and producing heat energy which displaces the pistons inside the cylinders. The displacement of the pistons in a reciprocating manner within the cylinders is converted to rotary motion by the crank shaft, and the engine is said to have been started. Cranking an engine is typically done by a starter motor mechanically coupled to the engine. The starter motor relies mainly on the vehicle battery to run during cranking.

Alternator

Electricity generators used in vehicles are often referred to as alternators since they generate electricity having an alternating current (AC). The generated AC is then rectified and converted to direct current (DC) to power the vehicle's electrical components and to charge the vehicle's battery. An alternator is mechanically coupled to a vehicle's internal combustion engine and converts mechanical energy provided by the engine to electrical energy. In order to charge a vehicle battery to a particular output voltage, an alternator is configured to generally produce an alternator output voltage which is higher than the battery voltage by a charging voltage offset. Accordingly, an alternator has a lower alternator output voltage limit, which is greater than a corresponding lower battery output voltage limit by the charging voltage offset. Similarly, an alternator has an upper alternator output voltage limit which is greater than a corresponding upper battery output voltage limit by the charging voltage offset. By way of example, a charging voltage offset may be 1V. For a 12V battery, the lower battery output voltage limit is 12.2V and accordingly the lower alternator output voltage limit is 13.2V for an alternator configured to charge the battery by a charging voltage offset of 1V. Similarly, for the 12V battery, the upper battery output voltage limit is 12.6V and accordingly the upper alternator output voltage limit is 13.6V for an alternator configured to charge the battery by a charging offset of 1V.

Alternator Failure

Alternators often fail after a period of use. In some cases, the alternator completely fails and does not produce any electric energy at all. In other cases, the alternator is either overcharging or undercharging the vehicle battery. If the alternator output voltage is less than the lower alternator output voltage limit, then the alternator is said to be "undercharging" the vehicle battery. For example, for a 12V vehicle battery discussed above and a charging offset voltage of 1V, if the alternator output voltage is less than the lower alternator output voltage limit of 13.2V, the alternator is said to be undercharging the vehicle battery. If the alternator output voltage is greater than the upper alternator output voltage limit of 13.6, the alternator is said to be "overcharging" the vehicle battery.

An alternator is mechanically and rotationally coupled a vehicle's engine in order to produce electricity. Similarly, a starter motor is mechanically and rotationally coupled to a vehicle's engine in order to crank the engine. With reference to FIG. 1, there is shown an engine 20 mechanically coupled to both an alternator 30 and a starter motor 70.

The engine 20 is comprises a plurality of cylinders (now shown) in which a corresponding plurality of pistons are disposed and configure for reciprocating motion. The engine 20 also houses a crank shaft (not shown) mechanically coupled to the pistons. As known in the art, the reciprocating motion of the pistons are converted to rotational motion by the crank shaft. At one end of the crank shaft, there is a drive pulley 24 connected with the crank shaft and rotatable therewith. At the opposite end of the crank shaft, there is a flywheel 28 connected with the crank shaft and rotatable therewith. The flywheel 28 may be in the form of a gear and have a plurality of teeth.

An alternator 30 is disposed alongside the engine 20 and rotationally coupled thereto. The alternator 30 may be affixed to the engine block or to any part of the vehicle chassis. The alternator 30 includes an alternator pulley 40 connected to and rotatable with an alternator shaft. The alternator pulley 40 is rotationally coupled to the drive pulley 24, typically by an alternator belt 42. Accordingly, the alternator shaft rotates with the rotation of the engine crank shaft.

A starter motor 70 is disposed alongside the engine 20. The starter motor 50 has a starter motor shaft 74 which provides rotational motion when electric power is provided to the starter motor 70. A starter motor pinion gear 76 is connected to the starter motor shaft 74 and is rotatable therewith. A starter motor solenoid 72 allows extending and retracting the starter motor shaft 74. To start the engine 20, the starter motor solenoid 72 extends the starter motor shaft 74 until the starter motor pinion gear 76 engages with the flywheel 28 and rotates the engine's crank shaft. Once the engine has started, the starter motor solenoid 72 retracts the starter motor shaft 74 so that the starter motor pinion gear 76 disengages from the flywheel 28.

When the engine 20 is off and is not being cranked (started), the crank shaft is not rotating and accordingly the drive pulley 24 is not rotating. As a result, the alternator pulley 40 is also not rotating and no electric power is generated by the alternator 30. Similarly, no power is applied to the starter motor 70 and hence the starter motor pinion gear 76 does not rotate. Additionally, the starter motor shaft 74 is in retracted mode towards the starter motor 70 and the starter motor pinion gear 76 is not engaged with the flywheel 28.

When the engine 20 is cranked (started), for example by a user turning a key in an ignition or actuating a push button ignition switch, electric power is applied from the vehicle's battery to the starter motor 70 including the starter motor solenoid 72. In response to receiving electric power, the solenoid extends the starter motor shaft 74 until the teeth of the starter motor pinion gear 76 engage with the teeth of the flywheel 28, as shown in dotted lines in the figure. Additionally, the starter motor 70 rotates the starter motor shaft 74 thus rotating the starter motor pinion gear 76 therewith. Since the flywheel 28 is in engagement with the starter motor pinion gear 76, the flywheel 28 rotates in the opposite direction to that of the starter motor pinion gear 76. The crankshaft rotates with the flywheel 28. As discussed above, the rotation of the crankshaft causes the engine to start. The drive pulley 24 rotates with the crankshaft. Since the alternator pulley 40 is rotationally coupled to the drive pulley 24 by the alternator belt 42, the alternator pulley 40 also rotates and the alternator 30 generates some electricity.

When the engine 20 is running, the starter motor 70 is turned off. Additionally, the starter motor solenoid 72 retracts the starter motor shaft 74 such that the starter motor pinion gear 76 is disengaged from the flywheel 28. As the engine is running, the drive pulley 24 is rotating by the action of the mechanical rotational motion produced by the engine 20. The alternator 30 rotates with the engine 20 and produces electricity to power the electrical components of the vehicle.

Figure 2:
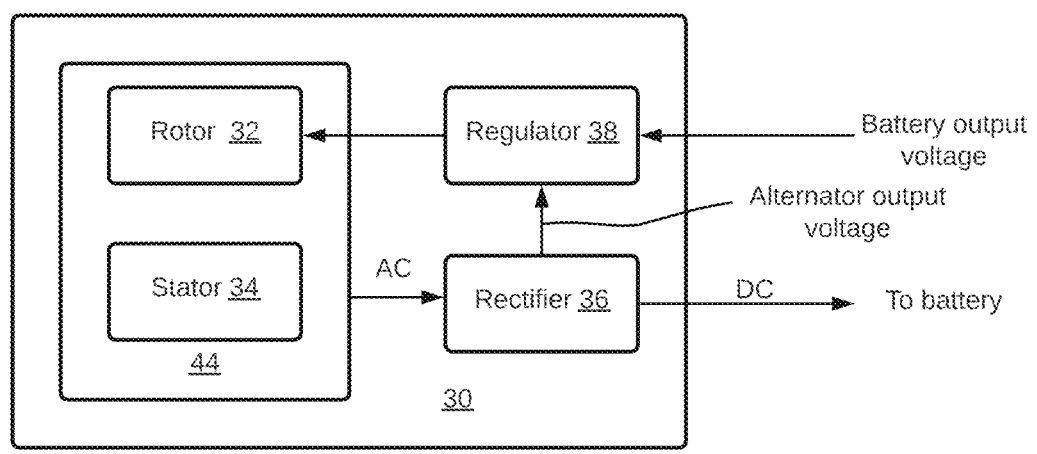
FIG. 2 is a block diagram showing the logical components of an alternator.

The structure and operation of an alternator 30 are known in the art. For illustration, FIG. 2 shows a high-level block diagram of an alternator 30 identifying its principal components. An alternator 30 includes a rotor 32, a stator 34, an alternator housing 44, a rectifier 36, and a regulator 38.

The rotor 32 is disposed on a shaft and rotatable therewith. The rotor 32 features an electromagnet (not shown) which is powered by the vehicle's battery and/or electric power generated by the alternator 30 itself. The power of the electromagnet affects the alternator output voltage. The higher the power of the electromagnet, the higher the alternator output voltage for the same rotational speed of the rotor shaft. Conversely, the lower the power of the electromagnet, the lower the alternator output voltage for the same rotational speed of the rotor shaft.

The stator 34 is circumferentially disposed inside the alternator housing 44 encompassing the rotor 32. The stator 34 is comprised of a plurality of coils typically connected in a star configuration, as known in the art. The coils have terminals at which the generated AC is provided.

The rectifier 36 converts the generated AC provided at the terminals of the coils into DC. In some example embodiments, the rectifier is comprised of a plurality of diodes, and at least one capacitor as known in the art. For a typical 3-phase alternator, there are at least 3 diodes.

The regulator 38 detects the alternator output voltage and ensures that it remains above the lower alternator output voltage limit and below the upper alternator output voltage limit. As shown the regulator 38 checks the battery output voltage and the alternator output voltage. As discussed above, the alternator output voltage is generally higher than the battery output voltage by a charging voltage offset. The regulator 38 determines the desired alternator output voltage based on the battery output voltage. If the alternator output voltage is different from the desired alternator output voltage, the regulator controls the power provided to the electromagnet of the rotor in order to maintain the alternator output voltage between the lower alternator output voltage limit and the upper alternator output voltage limit.

Rotating the alternator pulley 40 causes the rotor 32 to rotate with respect to the stator 34 and induce electricity in the stator 34. The generated electricity is in the form of an alternating current (AC) which is provided at the stator terminals (not shown). The rectifier 36 converts the generated AC to direct current (DC) output. The DC output may be provided to charge the vehicle battery, power the electromagnet of the rotor 32, and power the electrical components of the vehicle while the engine 20 is running.

The regulator 38 determines the desired alternator output voltage based on the battery operating voltage range. The regulator 38 then compares the alternator output voltage, provided thereto by the rectifier, as shown, with the desired alternator output voltage. Based on the comparison, the regulator may increase or decrease the electric power provided to the electromagnet of the rotor 32. For example, for a 12V battery, the alternator output voltage needs to be between 13.2V and 13.6V. If the alternator output voltage was at 14V, then the alternator is overcharging the battery.

The regulator 38 reduces the power provided to the electromagnet of the rotor 32. As a result, the alternator output voltage is reduced. This is repeated until the alternator output voltage is at most at the upper alternator output voltage limit of 13.6V. Conversely, if the alternator output voltage is below 13.2V, the regulator 38 increases the electric power provided to the rotor 32. As a result, the alternator output voltage is increased (for the same alternator shaft rotational speed), thus increasing the alternator output voltage. This is repeated until the alternator output voltage is at least at the lower alternator output voltage limit.

Figure 3A:
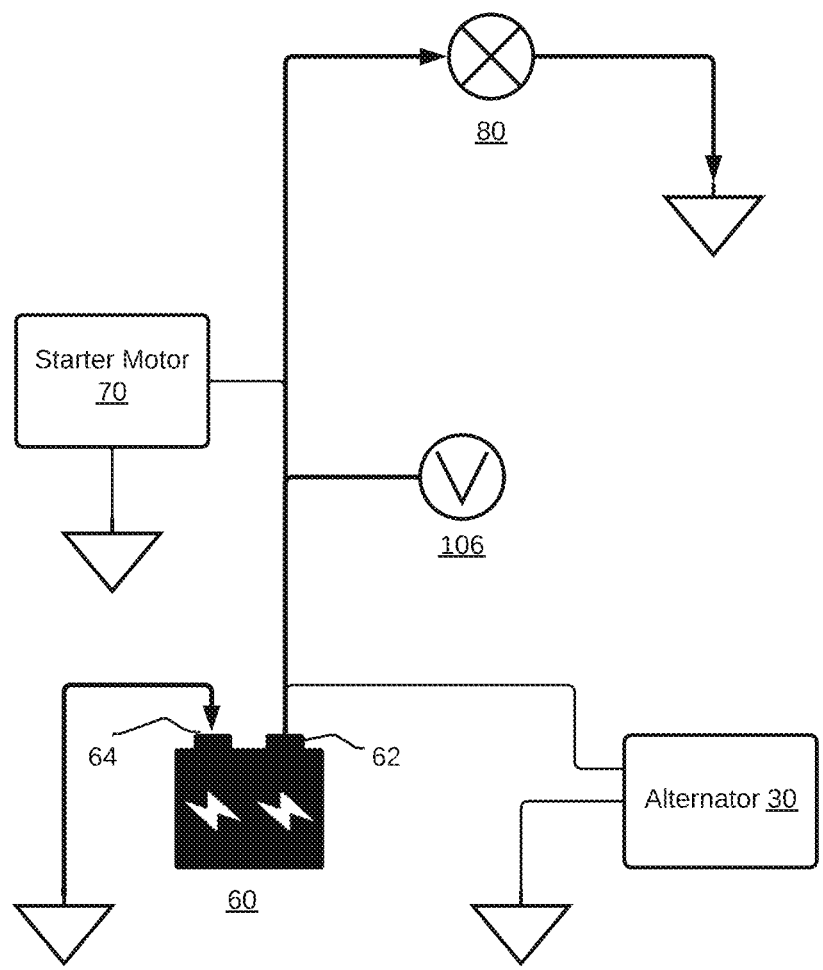
FIG. 3A is a schematic diagram showing selected components of an automotive electric system and current flow therebetween when the vehicle engine is off.
Figure 3B:
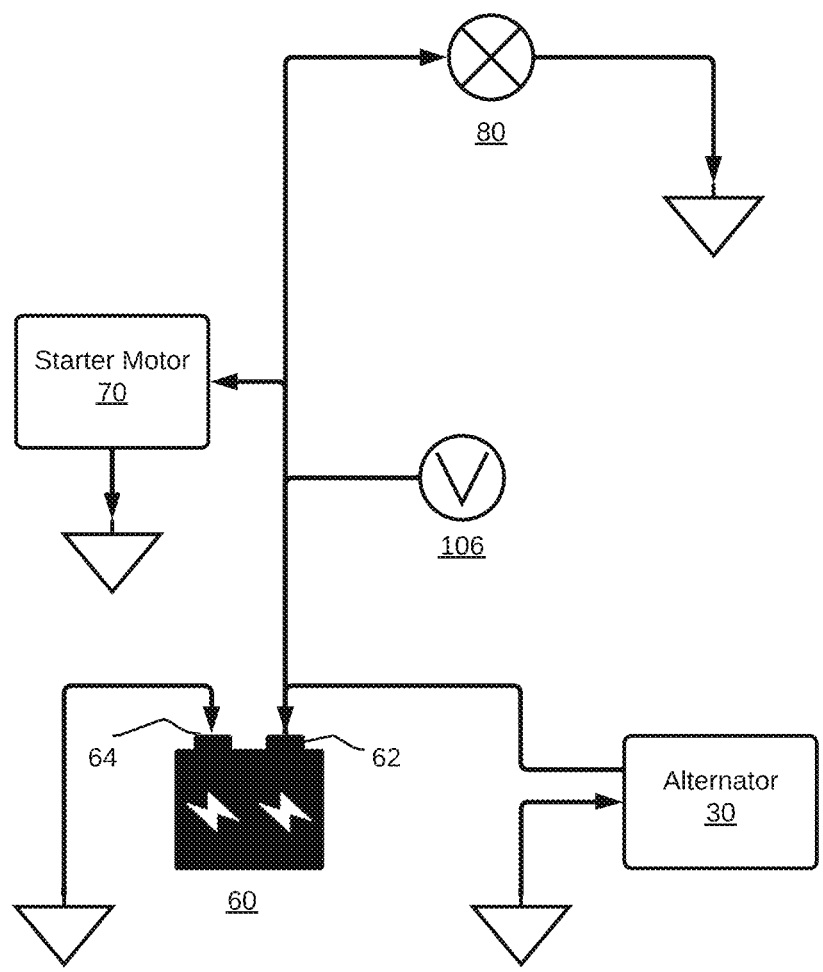
FIG. 3B is a schematic diagram of the components of FIG. 3B and current flow during a cranking event.
Figure 3C:
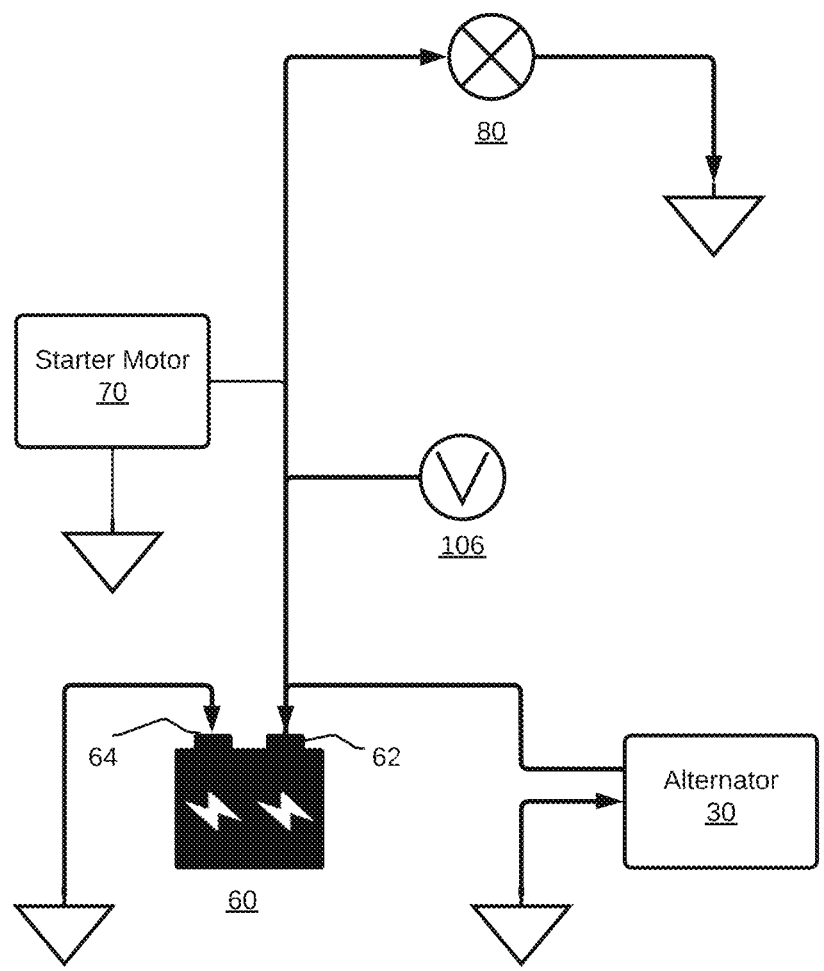
FIG. 3C is a schematic diagram of the automotive electric system of FIG. 3C during normal engine operation.

The electrical connections between the engine 20, the starter motor 70 and the alternator 30 are shown in FIGS. 3A-3C.

FIGS. 3A-3C depict a simplified schematic of a vehicle's electric subsystems including a battery 60, a starter motor 70, an alternator 30, a voltage-sensing device 106, and an electrical component 80 shown as a light bulb. The battery 60 may be a lead acid battery or any other suitable type of battery used in vehicles. The battery 60 has a positive battery terminal 62 connected to the electrical component 80, to the starter motor 70 and to the alternator 30. The battery 60 also has a negative terminal 64 connected to the ground (i.e., the vehicle's metal chassis). The starter motor 70 is connected to the positive battery terminal 62 and to the ground. The alternator is connected to the positive battery terminal 62 and to the ground. The electrical component 80 may be any one of vehicle lights, gauges, air conditioner or entertainment system. The voltage-sensing device 106 is connected to the positive battery terminal 62 and the alternator output. The voltage measuring device may be a voltmeter, galvanometer, analog-to-digital converter (ADC), or any other suitable device that can measure voltage.

Turning first to FIG. 3A. In this figure, the engine 20 is in off mode. In other words, the engine 20 is neither running nor being cranked. Accordingly, the alternator 30 is not rotating and is not producing any electric power. The only source of electricity in the vehicle is the battery 60. Thickened black lines in FIG. 3A show current flow between the battery 60 and the electrical component 80. Since the battery 60 provides electric power to the electrical component 80 and is not being charged. The voltage measured by the voltage-sensing device 106 is the voltage of the battery 60 only. In the off mode, and in the presence of an electrical component 80 which is turned on, the battery 60 is drained after some time. The time to drain the battery 60 depends on the load of the electrical component 80 and the capacity of the battery 60.

When a vehicle is started by a driver, for example by activating an ignition key, the engine 20, starter motor 70 and alternator 30 are said to be in a cranking state or undergoing a cranking event. With reference to FIG. 3B, the diagram shows the same vehicle's electric subsystems of FIG. 3A. FIG. 3B also shows the current flowing as solid black lines. During a cranking event, the battery 60 provides power to the starter motor 70 as indicated by the solid line between the positive battery terminal 62 and the starter motor 70. As the starter motor 70 is activated and engages the flywheel 28 as discussed above, the crankshaft of the engine rotates. As the alternator 30 is mechanically coupled to the crankshaft, the alternator shaft also rotates, and the alternator 30 starts generating some electricity. During cranking any electrical component 80 which is turned on consumes electric power from both the battery 60 and/or the alternator 30 depending on electric load of the electrical component 80. The voltage measured at the positive battery terminal 62, by the voltage-sensing device 106, during cranking is termed the "cranking voltage". The cranking voltage fluctuates as the starter motor 70 starts and as the alternator 30 starts generating electricity. As discussed below, there is a point at which the cranking voltage is at a minimum value termed the "minimum cranking voltage" and another point at which the cranking voltage is at a maximum value termed the "maximum cranking voltage".

When the engine 20 starts, the cranking event is terminated and the starter motor 70 is both disengaged from the engine 20 and is no longer powered up. This is illustrated in FIG. 3C. After cranking is terminated, the voltage measured at the positive battery terminal 62, by the voltage-sensing device 106, is termed the "device voltage". As shown in FIG. 3C, there are solid black lines between the alternator 30 and the positive battery terminal 62 as well as between the positive battery terminal 62 and the electrical component 80 indicating that the electrical components 80 may be consuming electric power from both the alternator 30 and the battery 60.

The inventors have observed and determine that certain characteristics of the cranking voltage and the device voltage may indicate a case of an alternator undercharging condition. Accordingly, methods and systems for detecting alternator undercharging conditions, are better understood once the voltage patterns observed during and after a cranking event are explained as is done with reference to FIG. 4.

Figure 4:
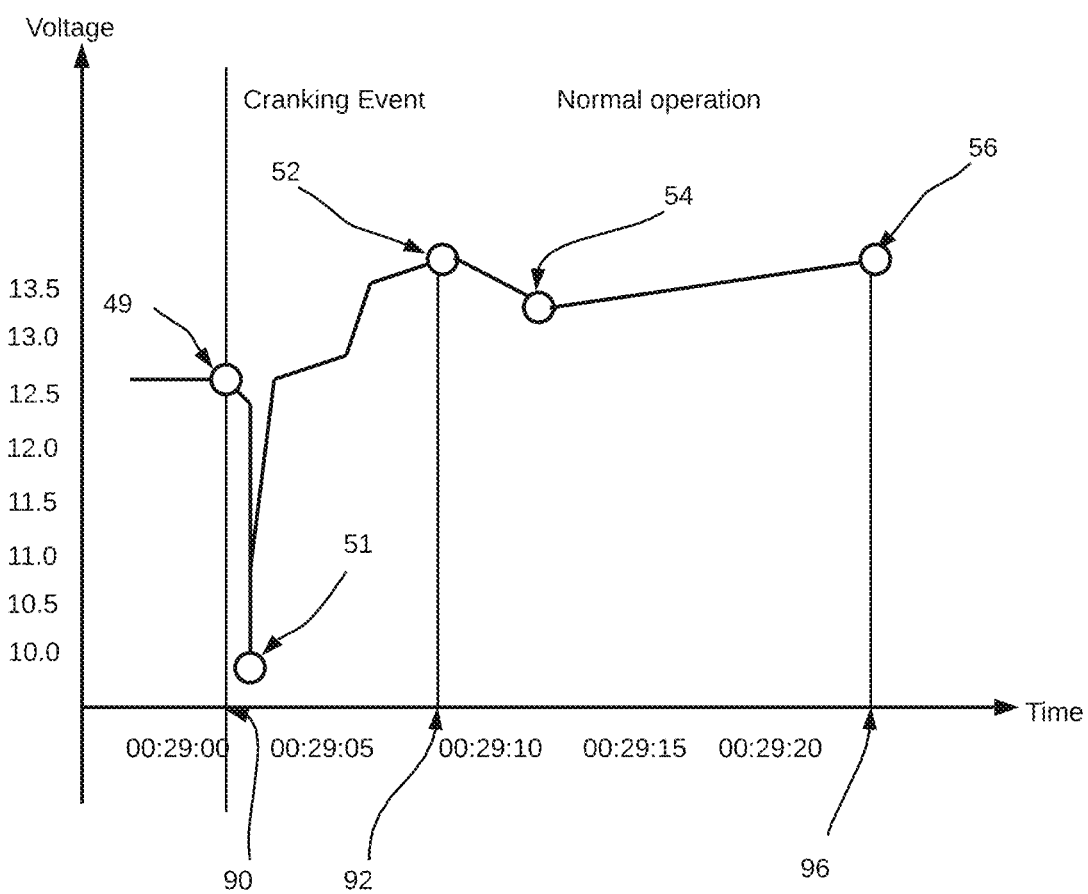
FIG. 4 is a graph depicting cranking and device voltages in an automotive electric system during and subsequent to a cranking event.

With reference to FIG. 4, there is shown a graph depicting voltage measured at the positive battery terminal (to which the output of the alternator is connected) during and after a cranking event. The horizontal axis represents time, while the vertical axis represents the voltage measured at the positive battery terminal 62. Before the cranking event, the measured voltage was around 12.6V. This represents the voltage at the positive battery terminal 62 with the alternator 30 not generating any electrical power. At time 90, the cranking event starts. The first cranking voltage 49 is unchanged and is around 12.6V. As the starter motor 70 draws a large amount of current from the vehicle battery in order to start, the battery output voltage drops significantly. As discussed, the output voltage of the battery during a cranking event is considered a cranking voltage. As can be seen, the cranking voltage drops until it is at a minimum cranking voltage 51 (which is around 9.8V approximately). As the starter motor 70 starts rotating and gains momentum, the current drawn by the starter motor 70 drops and accordingly the cranking voltage rises. Additionally, as the starter motor 70 rotates at a faster speed, so does the crank shaft of the engine, and so does the alternator shaft. As a result, the alternator 30 starts producing electricity, and the cranking voltage rises. As shown between the time 90 and the time 92.

At the time 92, the cranking voltage reaches a maximum cranking voltage 52. The maximum cranking voltage 52 is also the last cranking voltage measured. Once the engine has fully started, cranking is stopped, and the starter motor 70 is disengaged from the engine both electrically and mechanically. At this point, the voltage measured at the positive battery terminal 62 is the device voltage. The first device voltage 54 has the value of approximately 13.2V. At this point, the regulator 38 may increase the power provided to the electromagnet of the rotor 32 to bring the alternator output voltage to 13.6V so that it is higher by 1V than the battery output voltage, which was measured to be 12.6V before the cranking event. The device voltage reaches a maximum device voltage 56 at a time 96.

With reference to FIG. 4, a few observations can be made. Firstly, the maximum cranking voltage 52 and the maximum device voltage 56 are substantially equal. In reality they may not be identical and may be off by 0.1V or so. Secondly, the time period between the maximum cranking voltage 52 and the maximum device voltage 56 is relatively short. For example, in FIG. 4, the maximum cranking voltage 52 took place at approximately 00:29:08 and the maximum device voltage 56 took place at approximately 00:29:23. In other words, it took around 15 seconds after the maximum cranking voltage 52 for the device voltage to reach the maximum device voltage 56.

In vehicles where the alternator is either undercharging or overcharging the battery, the device voltage after cranking follows different patterns.

Figure 5:
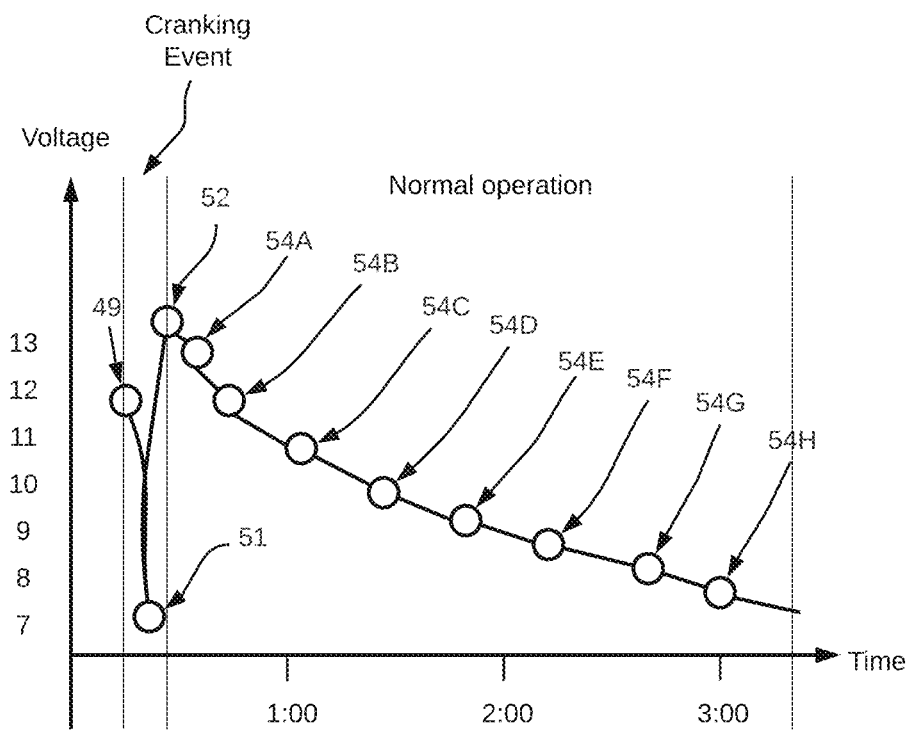
FIG. 5 is a vehicle charging profile depicting cranking and device voltages in an automotive electric system in which the alternator is undercharging the battery.

For example, with reference to FIG. 5, there is shown a vehicle charging profile for a vehicle in which the alternator is undercharging the battery. The graph covers a period of over 3 minutes starting with cranking. When cranking starts, the cranking starting voltage 49 was around 11.4V. At the start of cranking, the measured cranking voltage comprises the battery voltage at the positive battery terminal. As discussed above, a battery voltage value that is lower than the lower battery output voltage limit, indicates an undercharged battery. As cranking proceeds, the starter motor draws current and a minimum cranking voltage 50 is reached. As the starter motor gains momentum and the alternator starts generating electricity, the cranking voltage rises. The maximum cranking voltage 52 has a voltage value of 13.6V, which is a good value for a vehicle electric system including a 12V battery, as discussed above. Cranking ends and the maximum cranking voltage 52 is also the last cranking voltage. Past this point, the engine is in normal operation and the measured voltage is the device voltage. The first observed device voltage 54A is around 12.4V. The second observed device voltage 54B is around 11.3V. The third observed device voltage 54C is around 10.5V. Accordingly, the device voltage is dropping. Since the device voltage is an indication of the alternator output voltage, it can be deduced that the alternator output voltage is below the lower alternator output voltage limit, which for 12V batteries is 13.2V. Therefore, the device voltage pattern of FIG. 5 is indicative of an undercharging condition.

Figure 6:
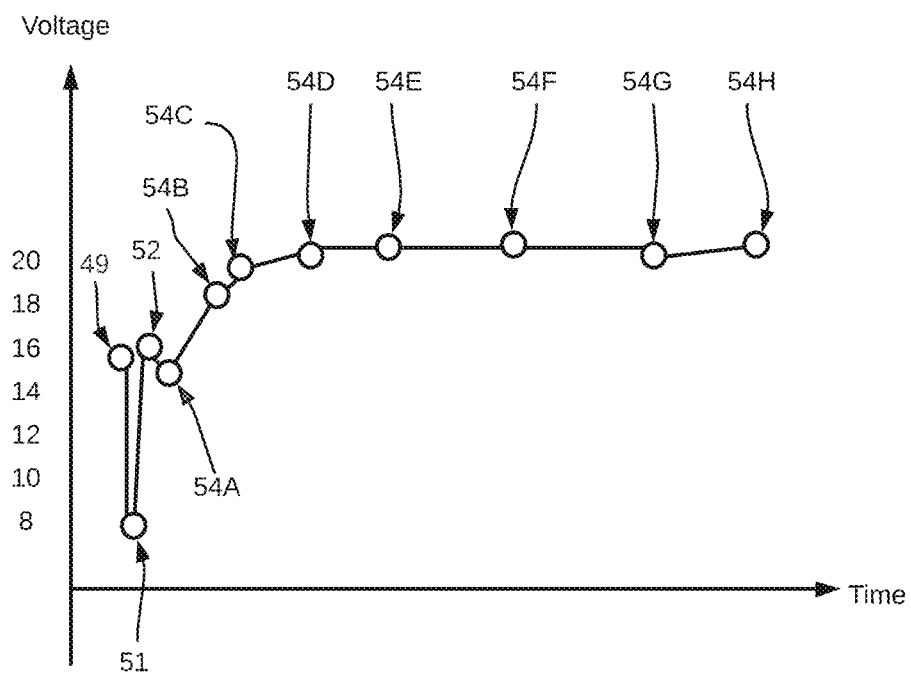
FIG. 6 is a graph depicting cranking and device voltages in an automotive electric system in which the alternator is overcharging the battery.

With reference to FIG. 6, there is shown a vehicle charging profile for a vehicle in which the alternator is overcharging the battery. The profile covers a period of approximately 10 seconds starting with cranking. First, it is observed that the first cranking voltage 49 is around 15.8V, which is high as it is expected that the battery voltage is at most 12.6V for a 12V battery. As cranking proceeds, the starter motor draws plenty of current and the cranking voltage drops to a minimum cranking voltage 50, which is around 7.6V. As before, the starter motor gains momentum and the alternator starts generating electricity, the cranking voltage rises. The maximum cranking voltage 52 is over 16V, which is high. The engine starts, and the first observed device voltage 54A is around 15V, the second observed device voltage 54B is around 18.5V, and the third observed device voltage 54C is around 19.5V. Subsequent device voltage values 54D, 54E, 54F, 54G and 54H are all around 20V. This voltage profile indicates that the alternator is overcharging the battery.

The duration between the timestamp of the maximum cranking voltage and the timestamp of the maximum device voltage varies with each cranking event. The inventors have analyzed voltage patterns from numerous vehicle electric systems of different makes and models and have observed certain distributions.

Figure 7A:
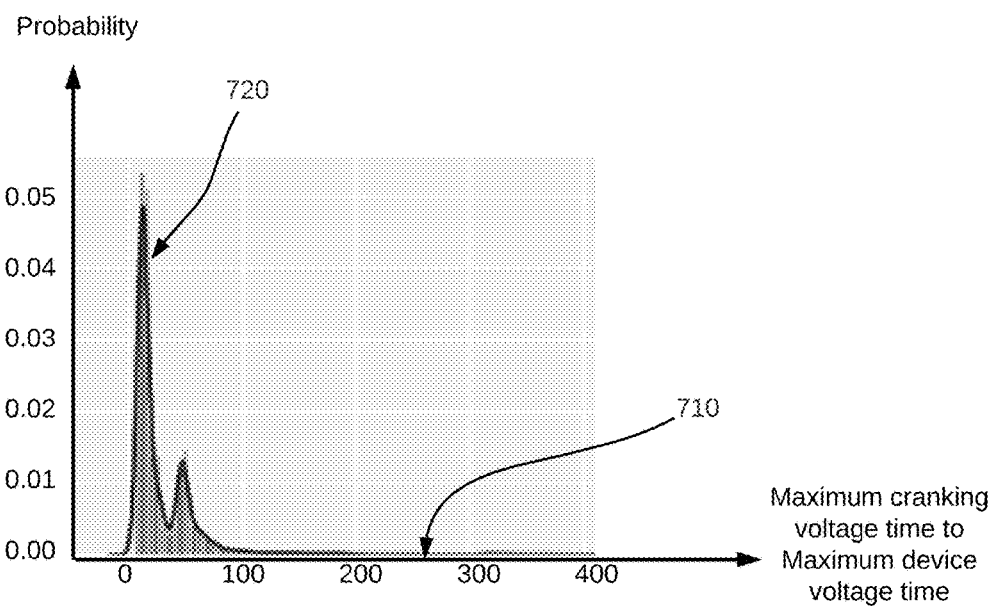
FIG. 7A is a histogram of the distribution of the duration between the maximum cranking voltage and the maximum device voltage for an international motor vehicle.

FIG. 7A shows a histogram 710 of the full distribution of the duration between maximum cranking voltage and maximum device voltage for an International MV having a 6.7L Diesel Cummins engine. It has been observed that in most cranking events, the maximum device voltage is reached less than 200 seconds after the maximum cranking voltage. A histogram 720 of the duration limited to where the duration between the maximum cranking voltage and the maximum device voltage is less than 200 seconds shows that for an international MV in the majority of cases, the duration between the maximum cranking voltage and the maximum device voltage is less than 50 seconds.

Figure 7B:
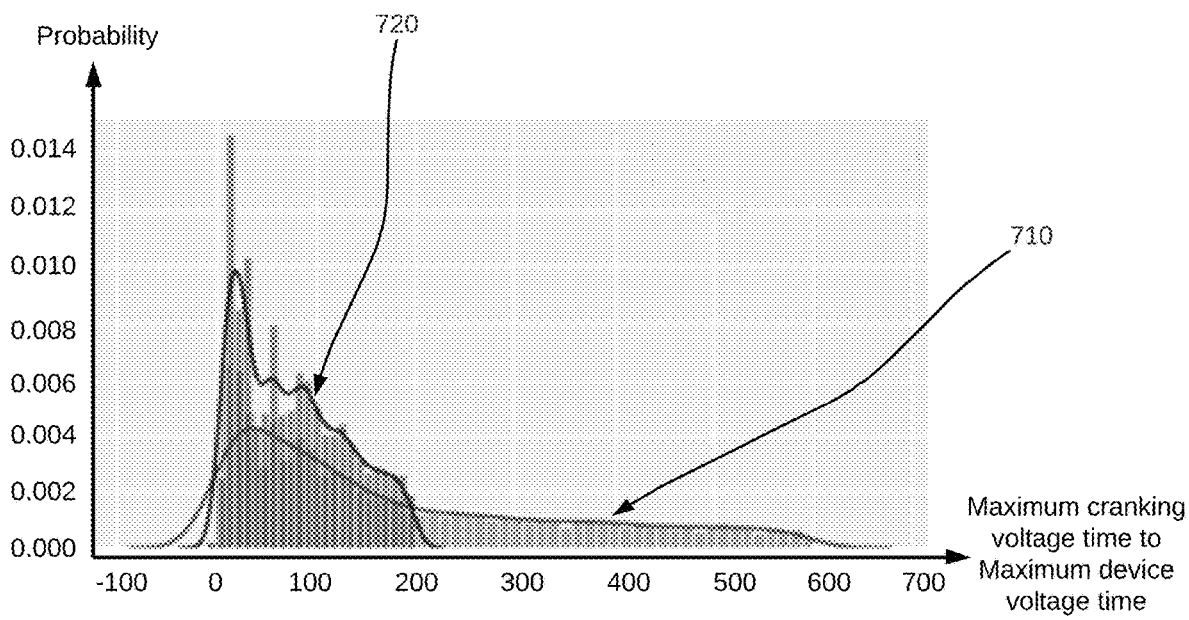
FIG. 7B is a histogram of the distribution of the duration between the maximum cranking voltage and the maximum device voltage for a Chevrolet Equinox.
Figure 7C:
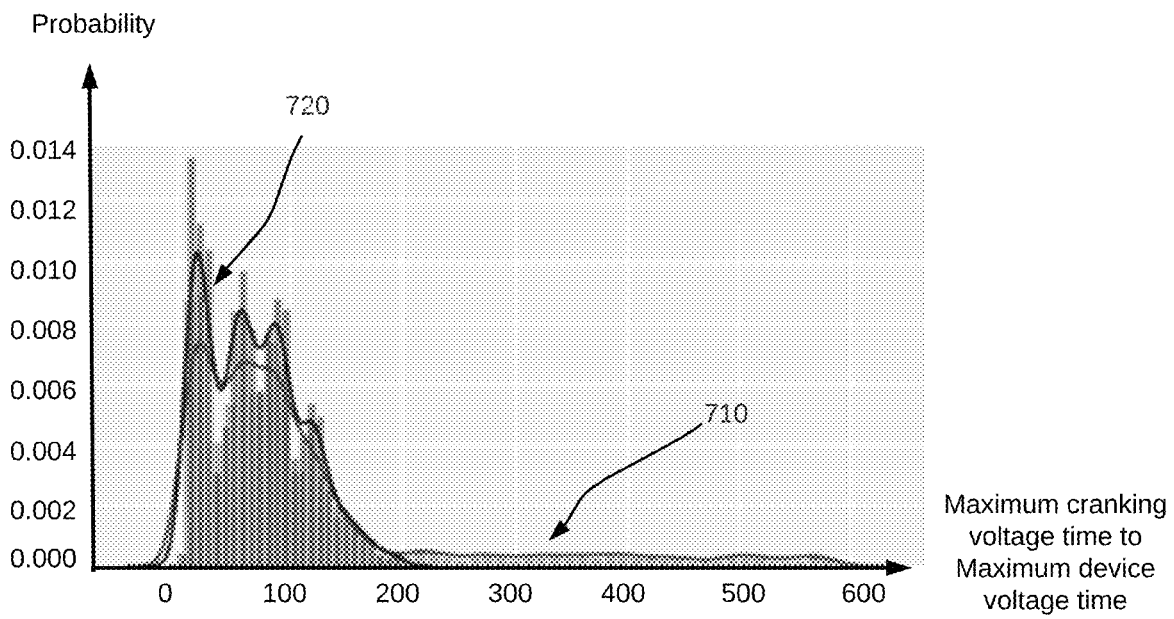
FIG. 7C is a histogram of the distribution of the duration between the maximum cranking voltage and the maximum device voltage for a Chevrolet Silverado.

FIG. 7B shows a histogram 710 of the full distribution of the duration between maximum cranking voltage and maximum device voltage for a Chevrolet Equinox having a 4 cylinder 1.5L engine. It has been observed that in most cranking events, the maximum device voltage is reached less than 600 seconds after the maximum cranking voltage. A histogram 720 of the duration limited to where the duration between the maximum cranking voltage and the maximum device voltage is less than 200 seconds shows that for a Chevrolet Equinox in the majority of cases, the highest distribution of the duration between the maximum cranking voltage and the maximum device voltage is also less than 50 seconds. For a Chevrolet Silverado, the distribution of the duration between the maximum cranking voltage and the maximum device voltage is shown in FIG. 7C. The distribution is somewhat similar to the Chevrolet Equinox.

Figure 7D:
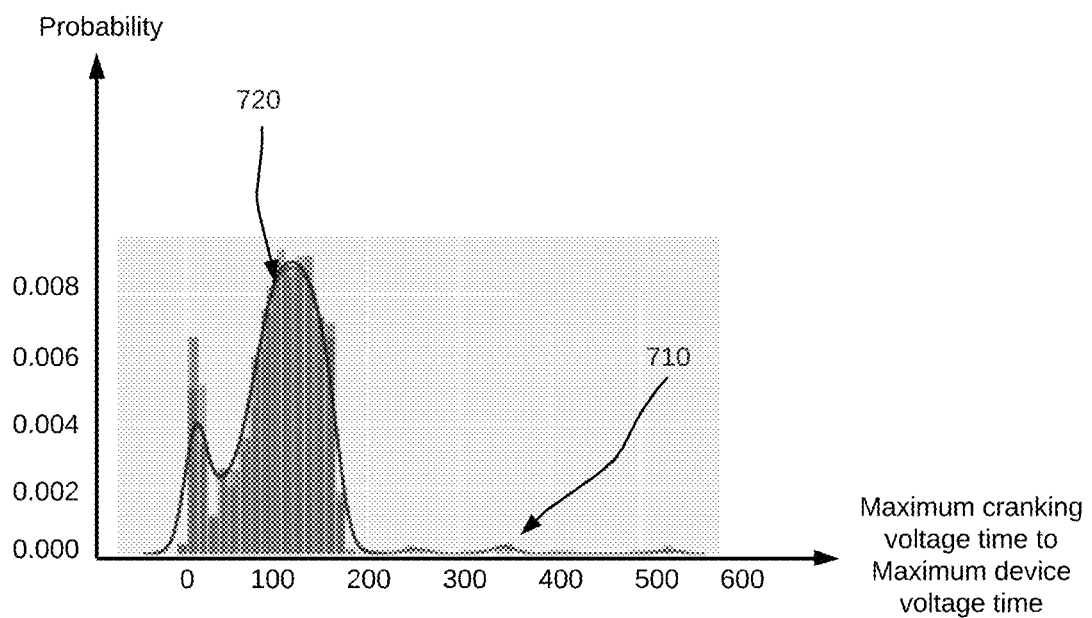
FIG. 7D is a histogram of the distribution of the duration between the maximum cranking voltage and the maximum device voltage for a Dodge Ram.

FIG. 7D shows a histogram 710 of the full distribution of the duration between maximum cranking voltage and maximum device voltage for a Dodge Ram having a 2500 3.6L V6 engine. It has been observed that in most cranking events, the maximum device voltage is reached less than 200 seconds after the maximum cranking voltage. A histogram 720 of the duration limited to where the duration between the maximum cranking voltage and the maximum device voltage is less than 200 seconds shows that for a Dodge Ram in the majority of cases, the duration between the maximum cranking voltage and the maximum device voltage is between 100 seconds and 150 seconds.

Figure 8:
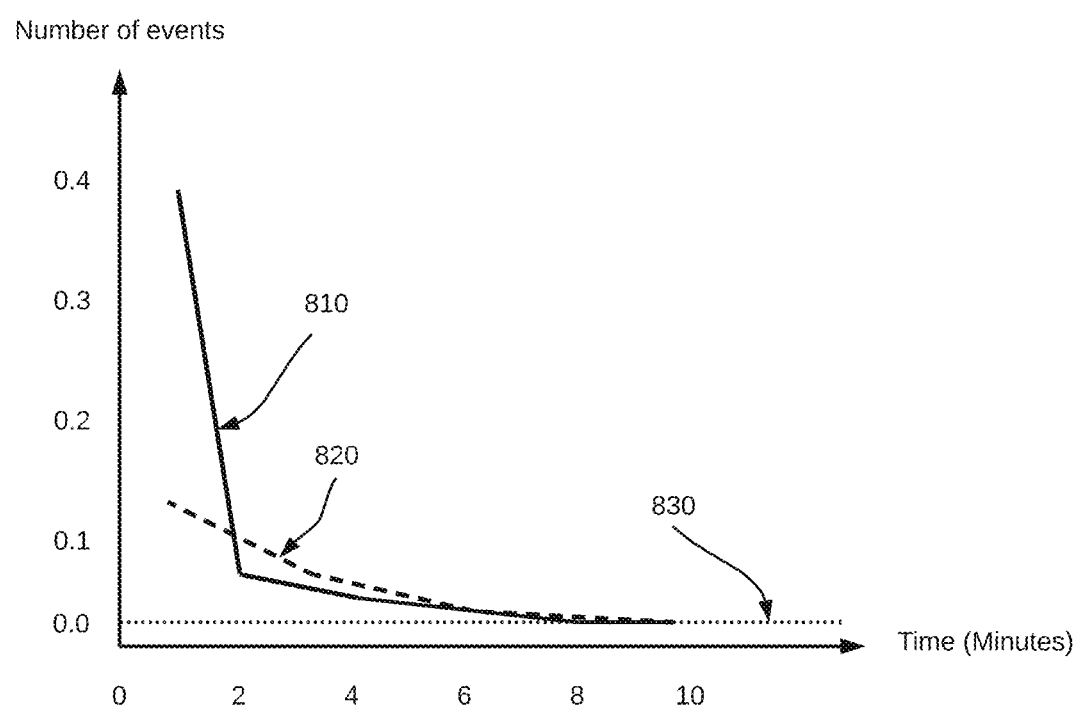
FIG. 8 is a histogram showing the distribution of normal, overcharging, and undercharging events in a Ford Transit vehicle.

The above observations relating to the duration between the maximum cranking voltage and the maximum device voltage become relevant when it is correlated with the monitoring of normal, overcharging, and undercharging events. For example, with reference to FIG. 8, graphs depicting the number of normal, overcharging, and undercharging events versus the time of the events are shown for a Ford Transit having a 3.5L V6 gasoline engine. The graph 810 depicts normal events, the graph 820 depicts undercharging events, and the graph 830 depicts overcharging events. It can be seen that normal events take place mostly under 2 minutes and generally up to 4 minutes. Undercharging events take place mostly before 3 minutes (180 seconds or approximately 200 seconds). In this graph, there were no overcharging events, and hence the overcharging graph 830 is flat.

The inventors have investigated numerous cases of alternator failure and observed a correlation between some failures and the duration between the maximum cranking voltage and the maximum device voltage. Specifically, if the duration between the maximum cranking voltage and the maximum device voltage exceeds an undercharging indication duration threshold, this indicates that an alternator undercharging condition is likely. If the duration between the maximum cranking voltage and the maximum device voltage exceeds the undercharging indication duration threshold repeatedly, then the vehicle operator or a fleet manager needs to be alerted of the potential undercharging condition. As a result, the alternator may be repaired or rebuilt.

In some embodiments, the detected maximum cranking voltages, and maximum device voltages along with their time stamps may be used by an on-board device to compute the time difference between each maximum cranking voltage and a corresponding maximum device voltage. If the time difference between the maximum cranking voltage and the maximum device voltage exceeds a particular threshold, then the on-board device may trigger an alert for the associated vehicle. For example, an indicator in the dashboard may light up and/or an alarm sound may alert the driver that of a potential alternator failure. In other embodiments, the maximum cranking voltages, the maximum device voltages, and their associated time stamps are included in telematics data captured from the vehicle using a telematics coupled to the vehicle. The telematics data is gathered by the telematics device and transmitted to a telematics server for analysis. The telematics server may be queried for data on specific vehicles or may be configured to send warnings to a user, such as a fleet manager, alerting them of vehicles with potential undercharging problems, for example.

Figure 9:
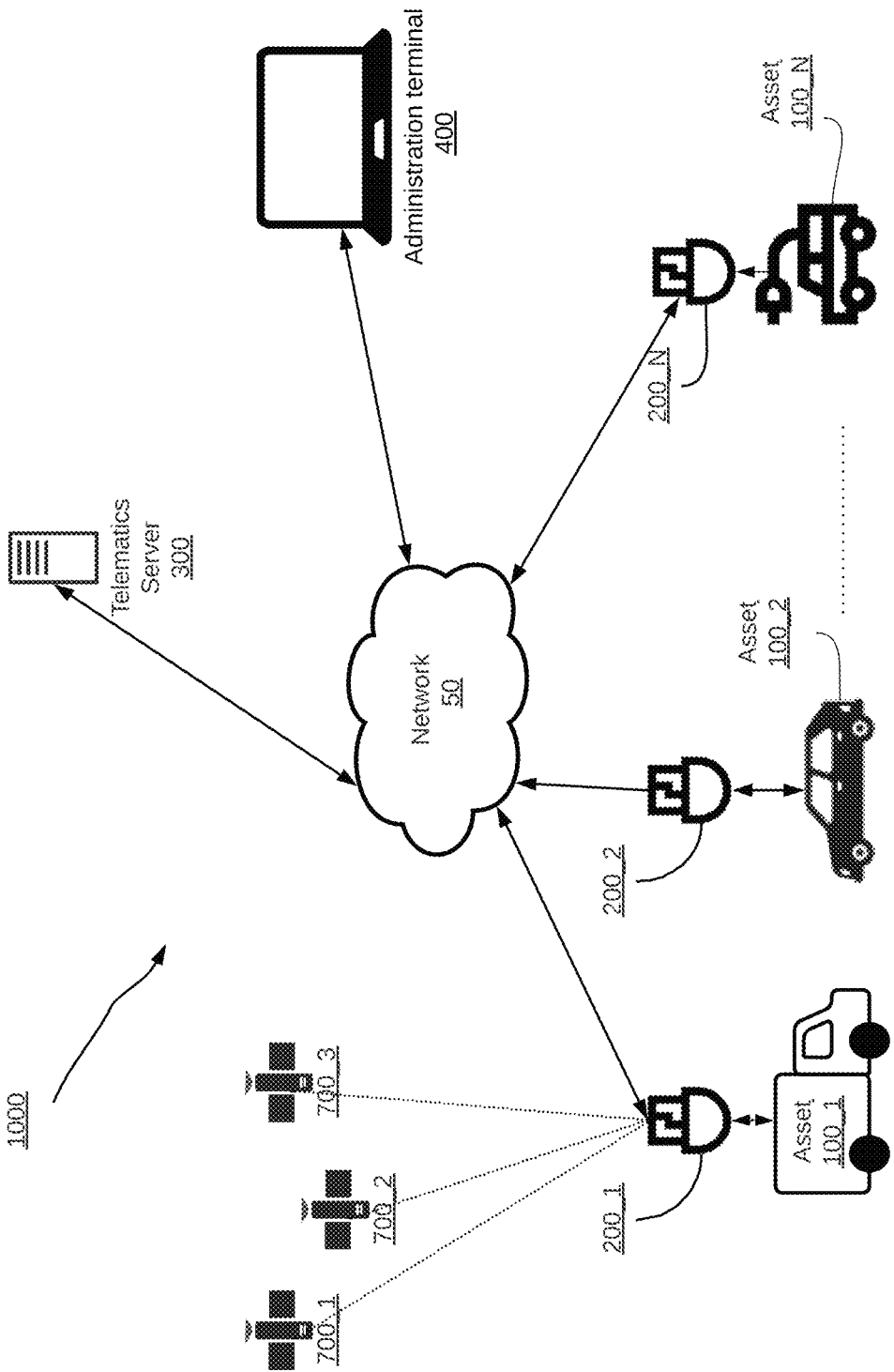
FIG. 9 is a schematic diagram of an example system for capturing data from an asset or asset tracking device.

FIG. 9 shows a high-level block diagram of a telematics system 1000. The telematics system 1000 includes a telematics server 300, and (N) telematics devices shown as telematics device 200_1, telematics device 200_2 . . . through telematics device 200_N ("telematics device 200"). The telematics system 1000 may also include an administration terminal 400. A network 50 may provide connectivity between the telematics devices 200 and the telematics server 300, and between the administration terminal 400 and the telematics server 300. FIG. 1 also shows a plurality of (N) assets named as asset 100_1, asset 100_2 . . . asset 100_N ("asset 100"); and a plurality of satellites 700_1, 700_2 and 700_3 ("satellite 700").

The assets 100 shown are in the form of vehicles. For example, the asset 100_1 is shown as a truck, which may be part of a fleet that delivers goods or provides services. The asset 100_2 is shown as a passenger car that typically runs on an internal combustion engine (ICE). The asset 100_3 is shown as an electric vehicle (EV). While the assets have been shown as vehicles, in some examples they may be airborne vehicles such as airplanes, helicopters, or drones. In other examples, the assets may be marine vehicles such as boats, ships, or submarines. In further examples, the assets may be stationary equipment such as industrial machines.

The telematics devices 200 are electronic devices which are coupled to assets 100 and configured to gather asset data from the assets 100. For example, in FIG. 9 the telematics device 200_1 is coupled to the asset 100_1. Similarly, the telematics device 200_2 is coupled to the asset 100_2 and the telematics device 200_3 is coupled to the asset 100_3. The components of a telematics device 200 are explained in further detail with reference to FIG. 10.

The network 50 may be a single network or a combination of networks such as a data cellular network, the Internet, and other network technologies. The network 50 allows the telematics devices 200 to communicate with the telematics server 300 and allows the administration terminal 400 to communicate with the telematics server 300.

The satellites 700 may be part of a global navigation satellite system (GNSS) and may provide location information to the telematics devices 200. The location information may be processed by a location module on the telematics device 200 to determine the location of the telematics device 200 (and hence the location of the asset 100 coupled thereto). A telematics device 200 that can periodically report an asset's location is termed an "asset tracking device".

A telematics server 300 is an electronic device having a large data store and powerful processing capability. The telematics server 300 may receive telematics data from telematics devices 200, including cranking and device voltages and their time stamps. The telematics server 300 may compute the likelihood of alternator undercharging conditions based on the received voltages and timestamps. The telematics server 300 may also send alerts for alternator undercharging conditions to one or more remote devices.

The administration terminal 400 is an electronic device, which may be used to connect to the telematics server 300 to retrieve data and analytics related to one or more assets 100. The administration terminal 400 may be a desktop computer, a laptop computer, a tablet, or a smartphone. The administration terminal 400 may run a web browser or a custom application which allows retrieving data and analytics, pertaining to one or more assets 100, from the telematics server 300 via a web interface of the telematics server.

In operation, a telematics device 200 connects to an asset 100 to gather asset data. The asset data may be combined with location data obtained by the telematics device 200 from a location module in communication with the satellites 700 and/or sensor information gathered from sensors in the telematics device 200. The combined data may be termed "telematics data". The telematics device 200 sends the telematics data, over to the telematics server 300 over the network 50. The telematics server 300 may process, aggregate, and analyze the telematics data to generate information about the assets 100 or a fleet of assets. The administration terminal 400 may connect to the telematics server 300, over the network 50, to access the generated information. Alternatively, the telematics server 300 may push the generated information to the administration terminal 400. For example, the asset data may comprise a maximum cranking voltage along with its timestamp and the maximum device voltage along with its timestamp as well as an asset identifier, such as a vehicle type. The telematics server 300 may perform some computations to determine, for the vehicle type, whether an alternator undercharging condition is likely. The telematics server 300 may generate alert information for the particular asset (vehicle) indicating the undercharging condition, if applicable. The alert information may be accessed by the administration terminal 400.

In the attached figures, a telematics device 200 is shown as a separate entity connected with a corresponding asset. It would be, however, apparent to those of skill in the art that other configurations are possible. For example, the telematics device 200 may be integrated with the asset 100 at the time of manufacturing. In other examples, the telematics device may be deployed on an asset but not connected therewith. For example, a telematics device 200 may be deployed in a vehicle and may monitor the vehicle's temperature, location, speed, and direction of travel solely using sensors or peripherals on board the telematics device 200 such as a temperature sensor, a GPS receiver, an accelerometer, and a gyroscope.

Figure 10:
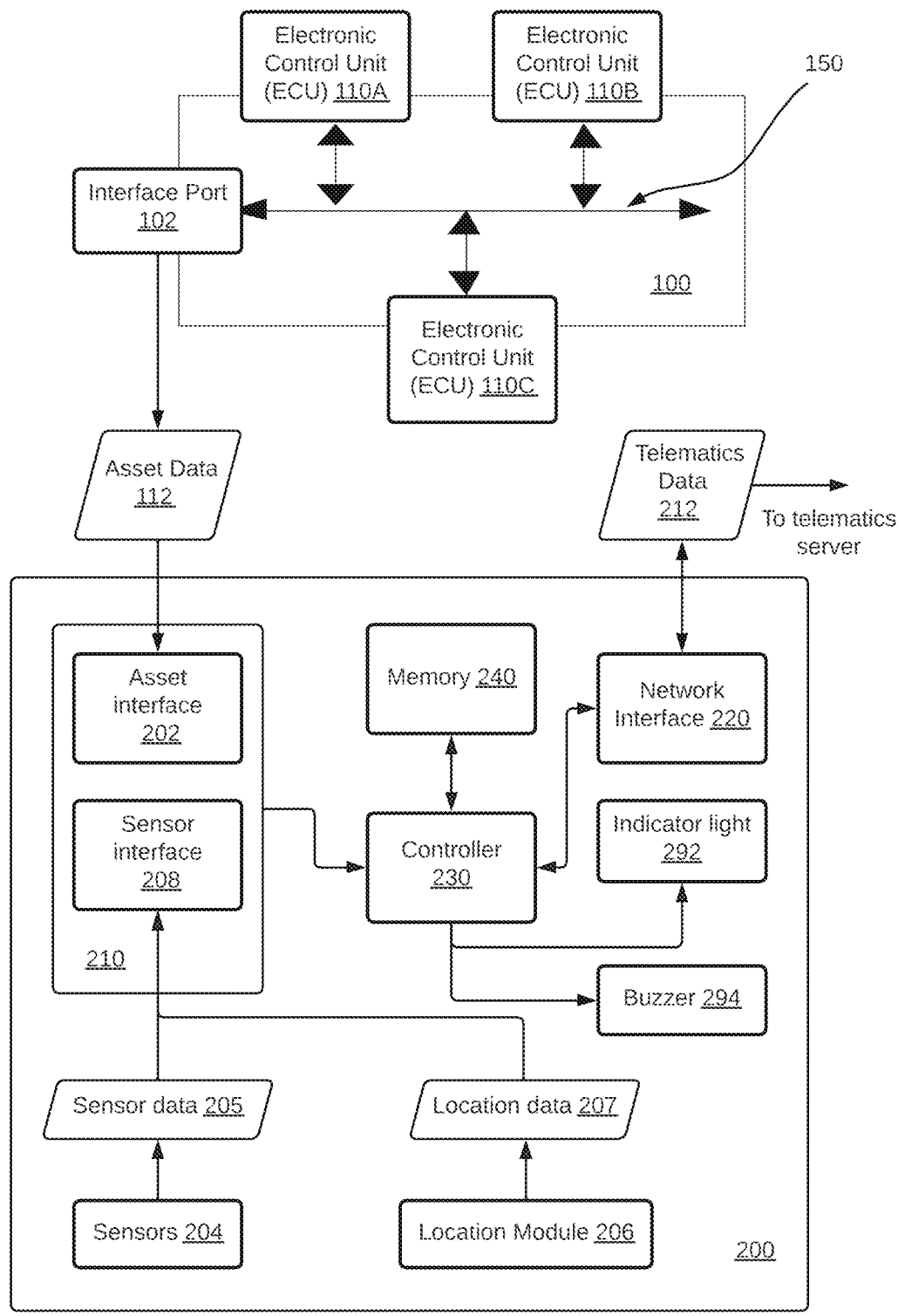
FIG. 10 is a block diagram showing a telematics device coupled to an asset.

Further details relating to the telematics device 200 and how it interfaces with an asset 100 are shown with reference to FIG. 10. FIG. 10 depicts an asset 100 and a telematics device 200 connected thereto. Selected relevant components of each of the asset 100 and the telematics device 200 are shown. For example, while the asset 100 may be a vehicular asset, only components relevant to gathering asset data are shown in the figure. The asset 100 may have a plurality of electronic control units (ECUs). An ECU is an electronic module which interfaces with one or more sensors for gathering information from the asset 100. For example, an oil temperature ECU may contain a temperature sensor and a controller for converting the measured temperature into digital data representative of the oil temperature. Similarly, a battery voltage ECU may contain a voltage sensor for measuring the voltage at the positive battery terminal and a controller for converting the measured voltage into digital data representative of the battery voltage. A typical vehicle may, for example, have around seventy ECUs. For simplicity, only a few of the ECUs 110 are depicted in FIG. 2. For example, in the depicted embodiment the asset 100 has three electronic control units including the ECU 110A, the ECU 110B, and the ECU 110C ("ECUs 110"). The ECU 110A, the ECU 110B, and the ECU 110C are shown to be interconnected via a bus, such as a Controller Area Network (CAN) bus 150. ECUs 110 interconnected using a CAN bus send and receive information to one another in CAN frames by placing the information on the CAN bus 150. When an ECU places information on the CAN bus 150, other ECUs 110 receive the information and may or may not consume or use that information. Different protocols are used to exchange information between the ECUs over a CAN bus. For example, ECUs 110 in trucks and heavy vehicles use the Society of Automotive Engineering (SAE) J1939 protocol to exchange information over a CAN bus 150. Most passenger vehicles use the On-Board Diagnostic (OBD) protocol to exchange information between ECUs 110 on their CAN bus 150. In industrial automation, ECUs use a CANopen protocol to exchange information over a CAN bus 150. An asset 100 may allow access to information exchanged over the CAN bus 150 via an interface port 102. For example, if the asset 100 is a passenger car, then the interface port 102 is most likely an OBD-II port. Data accessible through the interface port 102 is termed the asset data 112. An example of the asset data 112 includes the cranking and device voltages gathered from an ECU coupled to the battery and alternator, as will be described below. In some embodiments, the interface port 102 includes a power interface for providing power to a device connecting thereto.

The telematics device 200 includes a controller 230 coupled to a non-transitory memory 240, an interface layer 210 and a network interface 220. The telematics device 200 also includes one or more sensors 204 and a location module 206 coupled to the interface layer 210. The telematics device further includes some rudimentary output devices such as an indicator light 292 and a buzzer 294. In some embodiments (not shown), the telematics device 200 may have a dedicated power source or a battery. In other embodiments, the telematics device 200 may receive power directly from the asset 100. The telematics device 200 shown is an example. Some of the depicted components may be optional. For example, some telematics devices may not have a location module 206 and may rely on an external location module for obtaining location data 207. Some telematics devices may not have any sensors 204 and may rely on external sensors for obtaining sensor data 205.

The controller 230 may include one or any combination of a processor, microprocessor, microcontroller (MCU), central processing unit (CPU), processing core, state machine, logic gate array, application-specific integrated circuit (ASIC), field-programmable gate array (FPGA), or similar, capable of executing, whether by software, hardware, firmware, or a combination of such, the actions performed by the controller 230 as described herein.

The indicator light 292 is an electronic peripheral capable of emitting visual light. The indicator light 292 may be a light emitting diode (LED) or another form of light which can be activated either to display a solid light or a flashing light with different duty cycles. The indicator light 292 may be used to indicate an alert condition under control of firmware executed by the controller 230.

The buzzer 294 is an electronic device which produces an audible signal. The buzzer 294 may be a speaker or a piezoelectric transducer. The buzzer 294 may be used to indicate an alert condition under control of firmware executed by the controller 230.

The non-transitory memory 240 may include read-only-memory (ROM), random access memory (RAM), flash memory, magnetic storage, optical storage, and similar, or any combination thereof, for storing machine-executable instructions and data to support the functionality described herein. The non-transitory memory 240 is coupled to the controller 230 thus enabling the controller 230 to execute the machine-executable programming instructions stored in the non-transitory memory 240. The non-transitory memory 240 may store machine-executable instructions, which when executed by the controller 230, configures the telematics device 200 for receiving asset data 112 from the asset 100 via the asset interface 202, and for receiving sensor data 205 from the sensors 204 and/or location data 207 from the location module 206 via the sensor interface 208. The non-transitory memory 240 may also contain machine-executable programming instructions for combining asset data 112, sensor data 205 and location data 207 into telematics data 212. Additionally, the non-transitory memory 240 may further contain instructions which, when executed by the controller 230, configures the telematics device 200 to transmit the telematics data 212 via the network interface 220 to a telematics server 300 over a network 50.

In some embodiments, the non-transitory memory 240 may contain modules for analyzing the asset data 112 and generate an alert accordingly. For example, the non-transitory memory 240 may contain modules for analyzing cranking and device voltages and checking whether the alternator is overcharging or undercharging the vehicle's battery. In case an overcharging or an undercharging condition is detected, the firmware modules may activate the indicator light 292, the buzzer 294, or both in order to signal the alert condition.

In some embodiments, the memory may contain firmware modules for receiving alert messages from the telematics server over the network interface 220. For example, after sending the telematics data 212 to the telematics server, the telematics device 200 may receive, over the network interface 220, an alert message from the telematics server indicating an alert condition related to the operation of the vehicle. For example, the telematics device 200 may receive an alert message indicating that the vehicle coupled to the telematics device 200 is undergoing an alternator undercharging condition. The firmware modules may further configure the telematics device 200 to issue an alert in response to receiving the alert message. The issued alert may be in the form of a sound produced by the buzzer 294 or a light produced by the indicator light 292.

The location module 206 may be a global positioning system (GPS) transceiver or another type of location determination peripheral that may use, for example, wireless network information for location determination. The sensors 204 may be one or more of: a temperature sensor, a pressure sensor, an optical sensor, an accelerometer, a gyroscope, or any other suitable sensor indicating a condition pertaining to the asset 100 to which the telematics device 200 is coupled.

The interface layer 210 includes an asset interface 202 and a sensor interface 208. The sensor interface 208 is configured for receiving sensor data 205 and location data 207 from the sensors 204 and the location module 206, respectively. For example, the sensor interface 208 interfaces with the location module 206 and with the sensors 204 and receives both sensor data 205 and location data 207, respectively, therefrom. The interface layer 210 also includes an asset interface 202 to receive asset data 112 from the asset 100. In the depicted embodiment, the asset interface 202 is coupled to the interface port 102 of the asset 100. In other embodiments where the telematics device 200 is integrated into the asset 100, the asset interface 202 may receive the asset data 112 directly from the CAN bus 150. The asset data 112, received at the telematics device 200, from the asset 100 may be in the form of data messages, such as CAN frames. Asset data 112 may describe one or more of any of: a property, a state, and an operating condition of the asset 100. For example, where the asset 100 is a vehicle, the data may describe the speed at which the vehicle is travelling, a state of the vehicle (off, idle, or running), or an engine operating condition (e.g., engine oil temperature, engine RPM, or a battery voltage). In addition to receiving the asset data 112, in some embodiments the asset interface 202 may also receive power from the asset 100 via the interface port 102. The interface layer 210 is coupled to the controller 230 and provides the asset data 112, sensor data 205, and location data 207 to the controller 230.

The network interface 220 may include a cellular modem, such as an LTE-M modem, CAT-M modem, other cellular modem, Wi-Fi modem, or any other communication device configured for communication via the network 50 with which to communicate with the telematics server 300. The network interface 220 may be used to transmit telematics data 212 obtained from the asset 100 to the telematics server 300 for a telematics service or other purposes. The network interface 220 may also be used to receive instructions from the telematics server 300 as to how to communicate with the asset 100.

In operation, an ECU 110, such as the ECU 110A, the ECU 110B, or the ECU 110C communicates asset data over the CAN bus 150. Asset data exchanged, between the ECUs 110, over the CAN bus 150 are accessible via the interface port 102 and may be retrieved as asset data 112 by the telematics device 200. The controller 230 of the telematics device receives the asset data 112 via the asset interface 202. The controller 230 may also receive sensor data 205 from the sensor 204 and/or location data 207 from the location module 206 over the sensor interface 208. The controller 230 combines the asset data 112 with sensor and location data into telematics data 212. The controller 230 transmits the telematics data 212 to the telematics server 300 over the network 50 via the network interface 220.

In some embodiments, the telematics device 200 may process the asset data 112, sensor data 205, and/or location data 207 locally. For example, the telematics device 200 may process the cranking and device voltages provided as part of the asset data 112 in order to determine an alternator undercharging condition or an alternator overcharging condition. If an alert condition is detected, the controller 230 may activate an alerting device such as the indicator light 292, the buzzer 294, or both.

Figure 11:
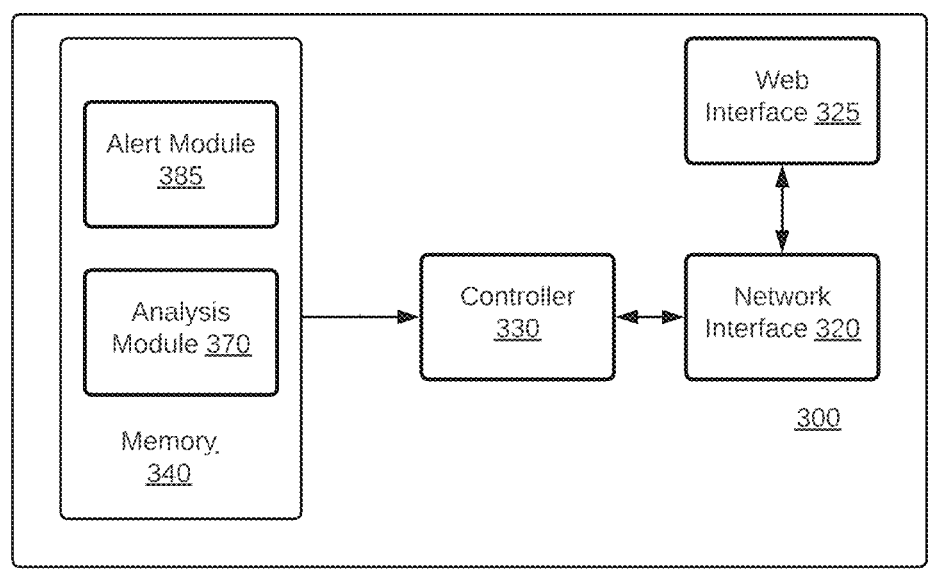
FIG. 11 is a block diagram of a telematics server, in accordance with embodiments of the present disclosure.

FIG. 11 is a block diagram of the telematics server 300 including selected software modules which perform the functions described in this disclosure. With reference to FIG. 11, the telematics server 300 has a controller 330, a network interface 320 for connecting to the network 50, and a non-transitory memory 340 for storing software modules. The non-transitory memory 340 contains software modules comprised of machine executable instructions which when executed the controller 330 perform analysis of telematics data sent to the telematics server 300 by the plurality of telematics devices 200. For example, the non-transitory memory 340 is shown to contain an analysis module 370 and an alert module 385. The analysis module 370 processes the asset data received at the telematics server 300, such as cranking and device voltages. The alert module 385 may send an alert indicating a particular condition detected by processing the asset data. For example, the analysis module 370 may detect an alternator undercharging condition based on asset data received from a telematics device coupled to a particular vehicle asset. The information and analysis provided by the telematics server 300 may be accessible, over the network 50, for viewing and inspection. The telematics server 300 may, for example, provide a web interface 325 through which telematics data gathered from one or more of the plurality of assets 100, as well as analytics related to the telematics data may be accessed. Alternatively, or additionally, the telematics server 300 may push telematics data and analytics related to one or more assets 100 to one or more electronic devices such as smartphones running a mobile application. For example, the alert module 385 may push an alert message to a smartphone running a mobile application to alert a fleet manager of an anticipated alternator undercharging condition on a vehicle asset.

Figure 12:
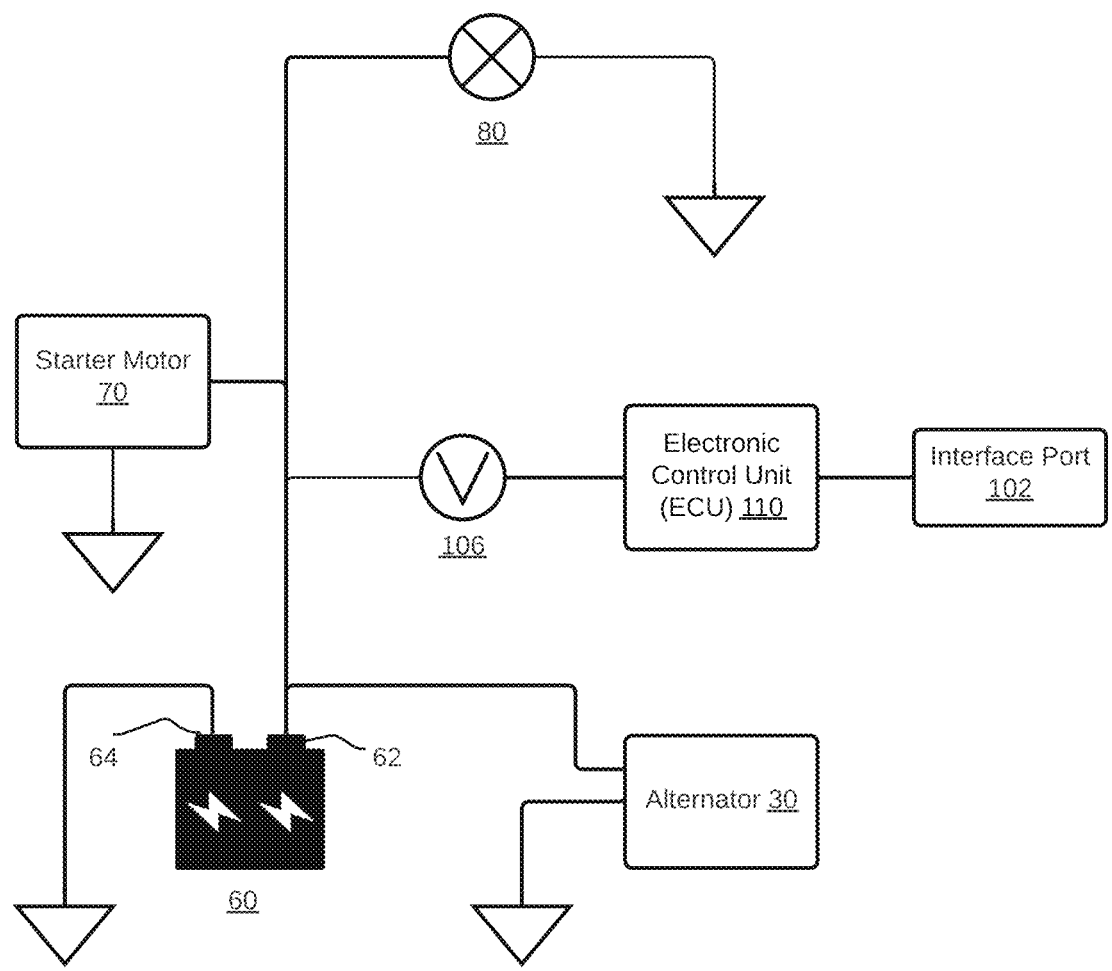
FIG. 12 is a schematic diagram showing selected components of an automotive electric system including a voltage-sensing device and an electronic control unit coupled thereto.

The ECUs 110 on an asset may include a voltage-sensing ECU that periodically reads cranking and device voltages and places the voltage values on the asset's shared bus, such as the CAN bus 150 of FIG. 10. For example, with reference to FIG. 12 which depicts components of a vehicle electrical system as shown above with reference to FIGS. 3A-3C. The components include the voltage-sensing device 106 described above. Coupled to the voltage-sensing device 106, there is an ECU 110. The ECU 110 directs the voltage-sensing device 106 to periodically read the voltage at the positive battery terminal 62. The ECU 110 also places the read information on the shared vehicle bus so it may be read by a telematics device via the interface port 102.

Figure 13:
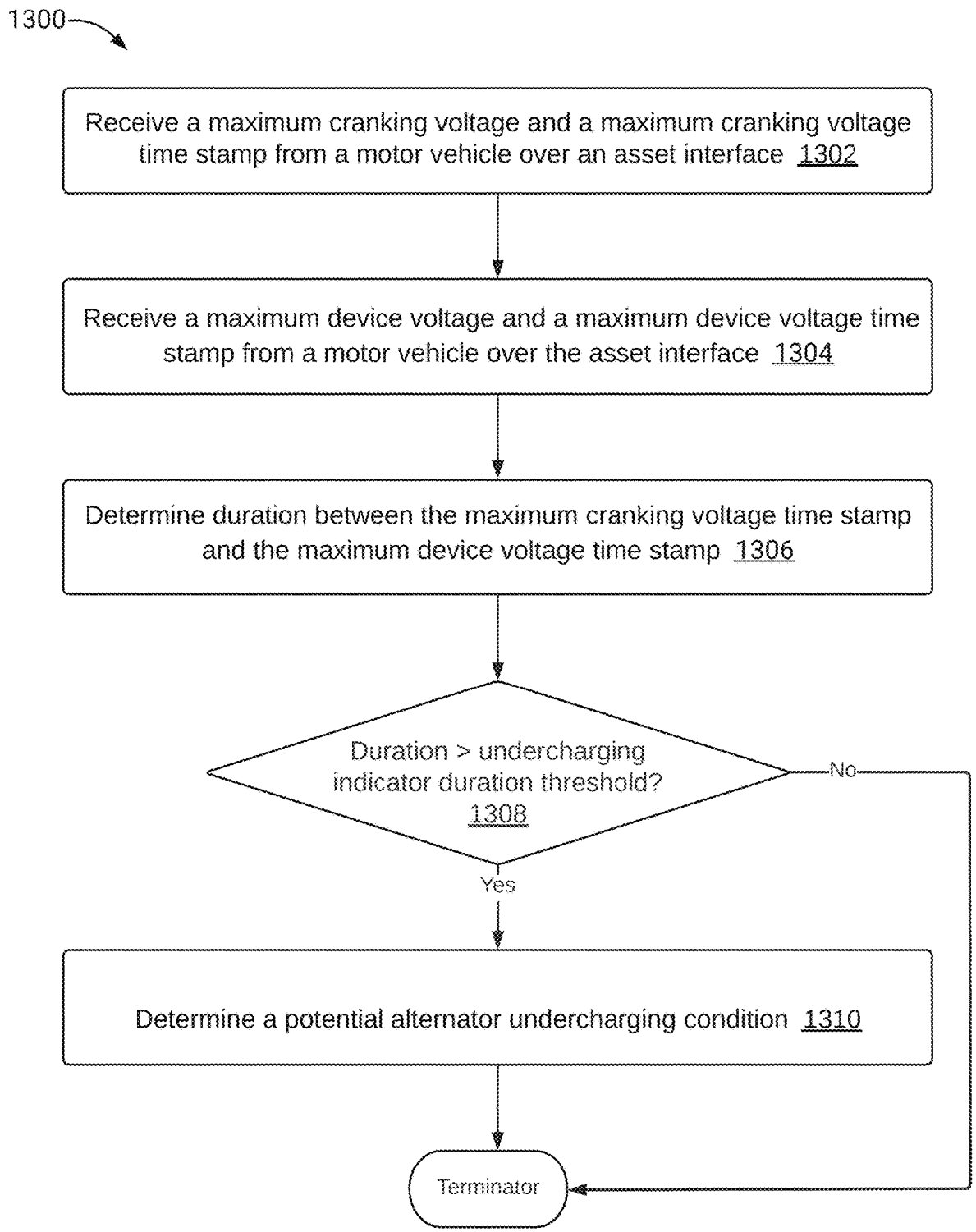
FIG. 13 is a flow chart of a method by a telematics device, the method for identifying a potential alternator undercharging condition, in accordance with embodiments of the present disclosure.

FIG. 13 is a flow chart of a method 1300 a telematics device, the method for identifying a potential alternator undercharging condition, in accordance with embodiments of the present disclosure. At step 1302, the telematics device receives a maximum cranking voltage and a maximum cranking voltage time stamp from an asset interface, such as an asset interface of a motor vehicle. At step 1304, the telematics device receives a maximum device voltage and a maximum device voltage time stamp from the asset interface. At step 1306, the telematics device determines the duration between the maximum cranking voltage time stamp and the maximum device voltage time stamp. Since the maximum device voltage time stamp is greater in value than the maximum cranking voltage time stamp, the duration is computed by subtracting the maximum cranking voltage time stamp from the maximum device voltage time stamp. At step 1308, the telematics device compares the computed duration with an undercharging indicator duration threshold. For example, for certain vehicles the undercharging indicator duration threshold may be 200 seconds, so the telematics device compares the computed duration with 200 seconds. If the computed duration is greater than the undercharging indicator duration threshold, then at step 1310 the telematics device determines a potential alternator undercharging condition. In some embodiments, the method 1300 involves repeating the steps 1302, 1304 and 1306 and determining a potential alternator undercharging condition if the condition at step 1308 is true at least once.

Figure 14:
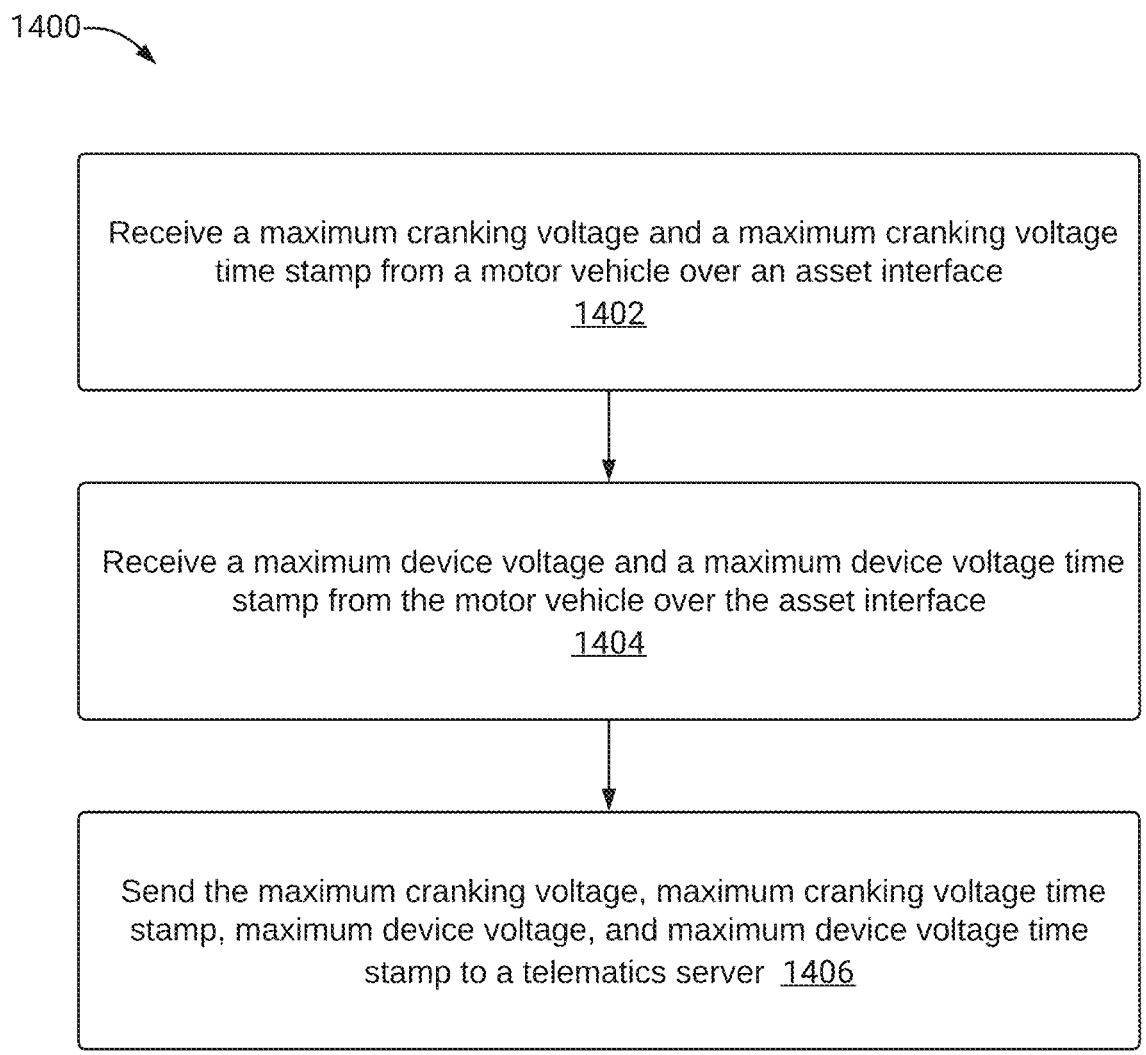
FIG. 14 is a flow chart of a method by a telematics device, the method for identifying a potential alternator undercharging condition, in accordance with embodiments of the present disclosure.

FIG. 14 is a flow chart of a method 1400 by a telematics device, the method for identifying a potential alternator undercharging condition, in accordance with other embodiments of the present disclosure. At step 1402, the telematics device receives a maximum cranking voltage and a maximum cranking voltage time stamp from an asset interface, such as an asset interface of a motor vehicle. At step 1404, the telematics device receives a maximum device voltage and a maximum device voltage time stamp from the asset interface. At step 1406, the telematics device sends the maximum cranking voltage, maximum cranking voltage time stamp, maximum device voltage, and maximum device voltage time stamp to a telematics server. In some embodiments, the steps 1402, 1404 and 1406 are repeated to provide the telematics server with multiple instances that it can use to determine a potential alternator undercharging condition.

Figure 15:
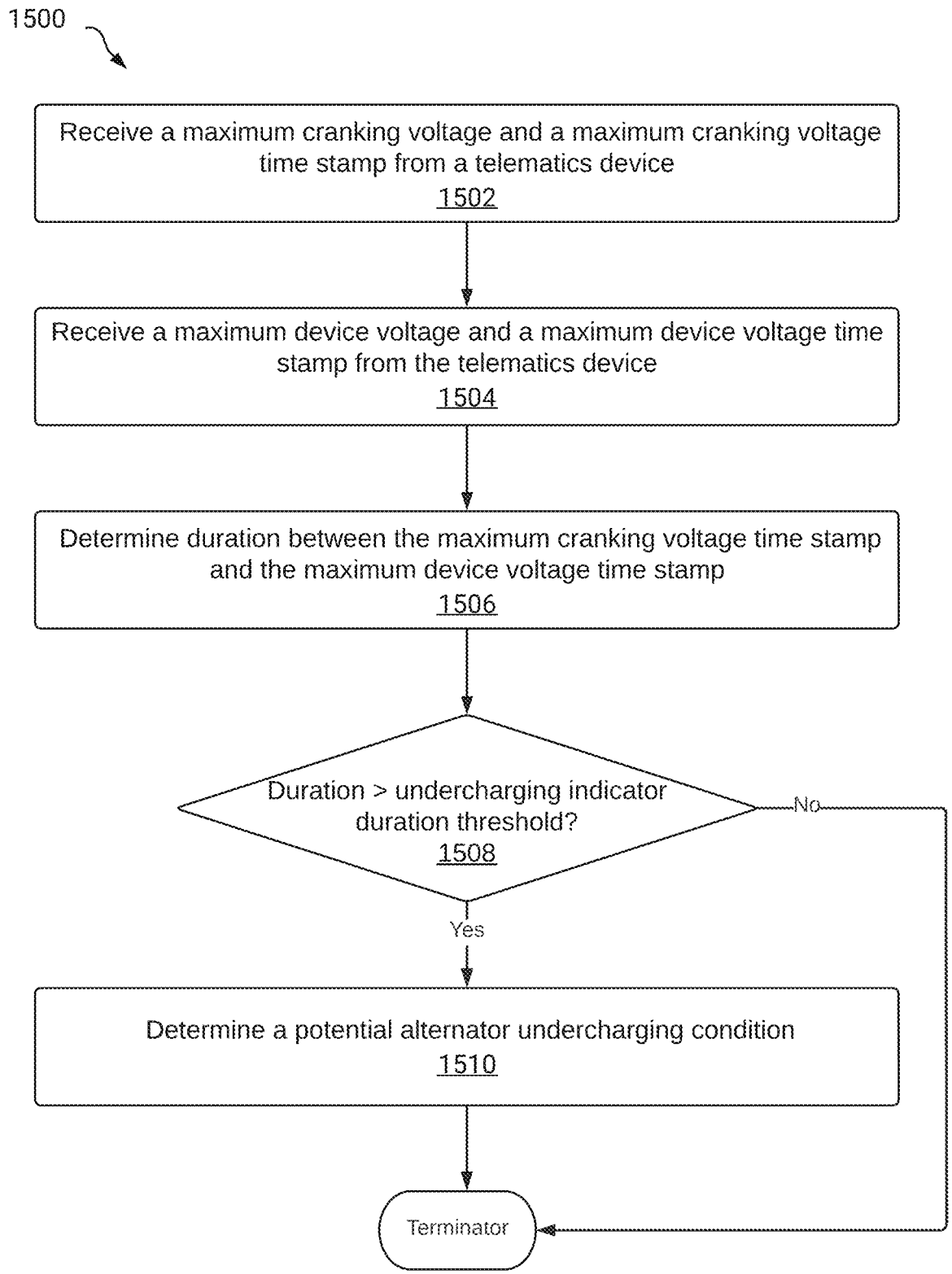
FIG. 15 is a flow chart of a method by a telematics server, the method for identifying a potential alternator undercharging condition, in accordance with embodiments of the present disclosure.

FIG. 15 is a flow chart of a method 1500 by a telematics server, the method for identifying a potential alternator undercharging condition, in accordance with further embodiments of the present disclosure. At step 1502, the telematics server receives a maximum cranking voltage and a maximum cranking voltage time stamp from a telematics device. At step 1504, the telematics server receives a maximum device voltage and a maximum device voltage time stamp from the telematics device. At step 1506, the telematics server determines the duration between the maximum cranking voltage time stamp and the maximum device voltage time stamp. Since the maximum device voltage time stamp is greater in value than the maximum cranking voltage time stamp, the duration is computed by subtracting the maximum cranking voltage time stamp from the maximum device voltage time stamp. At step 1508, the telematics server compares the computed duration with an undercharging indicator duration threshold. For example, for certain vehicles the undercharging indicator duration threshold may be 200 seconds, so the telematics device compares the computed duration with 200 seconds. If the computed duration is greater than the undercharging indicator duration threshold, then at step 1510 the telematics server determines a potential alternator charging condition.

It should be recognized that features and aspects of the various examples provided above can be combined into further examples that also fall within the scope of the present disclosure. The scope of the claims should not be limited by the above examples but should be given the broadest interpretation consistent with the description as a whole.

The invention claimed is:

1. A method by a telematics device coupled to an interface port of a motor vehicle via an asset interface of the telematics device, the method for predicting a potential alternator failure in the motor vehicle, the method comprising:
 a) receiving a maximum cranking voltage and a maximum cranking voltage time stamp from the motor vehicle over the asset interface;
 b) receiving a maximum device voltage and a maximum device voltage time stamp from the motor vehicle over the asset interface;
 c) determining a potential alternator undercharging condition when a duration between the maximum cranking voltage time stamp and the maximum device voltage time stamp is greater than an undercharging indicator duration threshold; and
 d) activating an alerting device in response to determining the potential alternator undercharging condition.

2. The method of claim 1, wherein the undercharging indicator duration threshold is 200 seconds.

3. The method of claim 1, wherein activating the alerting device comprises activating an indicator light.

4. The method of claim 1, wherein activating the alerting device comprises activating a buzzer.

5. A telematics device, comprising:
 a) a controller;
 b) an asset interface coupled to the controller, the asset interface for coupling to an interface port of a motor vehicle; and
 c) a non-transitory memory storing machine-executable instructions which, when executed by the controller, configure the telematics device to:
  i. receive a maximum cranking voltage and a maximum cranking voltage time stamp from the motor vehicle over the asset interface;
  ii. receive a maximum device voltage and a maximum device voltage time stamp from the motor vehicle over the asset interface; and
  iii. determine a potential alternator undercharging condition when a duration between the maximum cranking voltage time stamp and the maximum device voltage time stamp is greater than an undercharging indicator duration threshold; and
  iv. activate an alerting device in response to determining the potential alternator undercharging condition.

6. The telematics device of claim 5, wherein the undercharging indicator duration threshold is 200 seconds.

7. The telematics device of claim 5, wherein the machine-executable instructions which activate the alerting device comprise machine-executable instructions which activate an indicator light.

8. The telematics device of claim 5, wherein the machine-executable instructions which activate the alerting device comprise machine-executable instructions which activate a buzzer.

9. A method comprising:
 receiving, by a telematics device, a maximum cranking voltage and a maximum cranking voltage time stamp from an interface port of a motor vehicle over an asset interface of the telematics device;
 receiving, by the telematics device, a maximum device voltage and a maximum device voltage time stamp from the interface port of the motor vehicle over the asset interface of the telematics device;
 sending, by the telematics device, the maximum cranking voltage, the maximum cranking voltage time stamp, the maximum device voltage, and the maximum device voltage time stamp, over a network interface of the telematics device, to a telematics server;
 determining, by the telematics server, a potential alternator undercharging condition when a duration between the maximum cranking voltage time stamp and the maximum device voltage time stamp is greater than an undercharging indicator duration threshold; and
 sending, by the telematics server, an indication of a potential alternator undercharging condition to an administration terminal over the network interface.

10. The method of claim 9, wherein the undercharging indicator duration threshold is 200 seconds.

* * * * *